(12) United States Patent
Hinkle et al.

(10) Patent No.: US 11,682,444 B2
(45) Date of Patent: Jun. 20, 2023

(54) DYNAMIC RANDOM-ACCESS MEMORY ARRAY INCLUDING SENSOR CELLS

(71) Applicant: Lenovo Global Technology (United States) Inc., Morrisville, NC (US)

(72) Inventors: Jonathan Hinkle, Raleigh, NC (US); Jose M Orro, Cary, NC (US)

(73) Assignee: Lenovo Golbal Technology (United States) Inc., Morrisville, NC (US)

( * ) Notice: Subject to any disclaimer, the term of this patent is extended or adjusted under 35 U.S.C. 154(b) by 62 days.

(21) Appl. No.: 17/489,546

(22) Filed: Sep. 29, 2021

(65) Prior Publication Data
US 2023/0099478 A1 Mar. 30, 2023

(51) Int. Cl.
*G11C 7/04* (2006.01)
*G11C 11/406* (2006.01)
*G11C 11/4091* (2006.01)
*G11C 7/06* (2006.01)
*G11C 11/4099* (2006.01)
*G11C 11/4096* (2006.01)
*G11C 11/408* (2006.01)

(52) U.S. Cl.
CPC ........ *G11C 11/40615* (2013.01); *G11C 7/065* (2013.01); *G11C 11/4085* (2013.01); *G11C 11/4091* (2013.01); *G11C 11/4096* (2013.01); *G11C 11/4099* (2013.01); *G11C 11/40622* (2013.01)

(58) Field of Classification Search
CPC .............. G11C 11/40615; G11C 7/065; G11C 11/40622; G11C 11/4085; G11C 11/4091; G11C 11/4096; G11C 11/4099
See application file for complete search history.

(56) References Cited

U.S. PATENT DOCUMENTS

| 3,796,998 | A | * | 3/1974 | Appelt | G11C 11/406 365/222 |
| 4,982,369 | A | * | 1/1991 | Tatematsu | G11C 11/406 365/194 |
| 11,417,385 | B1 | * | 8/2022 | Ito | G11C 11/40626 |
| 11,521,669 | B2 | * | 12/2022 | Enomoto | G11C 11/4082 |
| 2017/0140807 | A1 | * | 5/2017 | Sun | G11C 29/028 |
| 2022/0115057 | A1 | * | 4/2022 | Pope | G11C 11/4078 |

* cited by examiner

*Primary Examiner* — Mushfique Siddique
(74) *Attorney, Agent, or Firm* — Jeffrey L. Streets; Streets Lawfirm, P.C.

(57) ABSTRACT

A dynamic random-access memory array includes a plurality of memory cells and sensor cells physical arranged in a row. The sensor cells include a transistor and a capacitor having an input terminal connected to a first non-gate terminal of the transistor. A wordline is connected to transistor gates of both the memory cells and sensor cells in the row. A sensor amplifier has inputs connected to the sensor cell, a high voltage reference line, and a low voltage reference line, and an output in communication with a row refresh circuit. If the sensor amplifier detects that the sensor cell voltage falls outside of the range of the high and low voltage reference lines, then a trigger signal is output to request that the row refresh circuit perform a priority row refresh of the memory cells and the sensor cell in the row.

21 Claims, 9 Drawing Sheets

DRAM Array

DYNAMIC RANDOM-ACCESS MEMORY ARRAY INCLUDING SENSOR CELLS

BACKGROUND

The present disclosure relates to systems and method for mitigating DRAM disturbance errors, such as the errors caused by a rowhammer attack.

BACKGROUND OF THE RELATED ART

Dynamic random-access memory (also known as dynamic RAM or DRAM) is a type of random-access semiconductor memory that stores each bit of data in a memory cell consisting of a tiny capacitor and a transistor. The capacitor of the memory cell can either be charged or discharged (not charged) to represent one of the possible binary values 0 and 1. However, the electric charge on the capacitors slowly drops. In order to prevent data loss as a result of the capacitor losing charge over time, DRAM requires a memory refresh circuit that periodically reads and then immediately rewrites the data in the capacitors. It is the write operation that restores the capacitors to their original charge. Refresh circuitry performs a refresh cycle on each row of the DRAM one row at a time to assure that each memory cell is periodically refreshed. A refresh rate may be used to describe the frequency with which each memory cell is refreshed.

Dynamic Random-Access Memory (DRAM) devices have been found to be vulnerable to disturbance errors induced by a rowhammer attack. A rowhammer attack directs a high rate of accesses to a particular DRAM memory address to induce one or more bit flips in memory cells that are physically adjacent or nearby to the memory cells of the particular DRAM memory address. For example, a rowhammer attack may generate an adversarial workload that generates the high rate of memory accesses directed at a particular memory address or row for the purpose of inducing a disturbance error that will flip the value of security-critical bits in an adjacent memory address or row.

Various approaches to mitigate rowhammer attacks have been considered, such as throttling access to the same row or increasing the refresh rate of the entire DRAM. However, these approaches cause substantial losses in DRAM overall performance, substantial increases in power consumption, and do not effectively prevent a rowhammer attack. Error Correction Code (ECC) and other error correction techniques could also be used to mitigate rowhammer attacks, but rowhammer attacks have been proven that overcome this error protection and can even be targeted to bypass the ECC.

BRIEF SUMMARY

Some embodiments provide an apparatus comprising a dynamic random-access memory array including a plurality of memory cells physical arranged in a row, wherein each of the memory cells includes a memory cell transistor and a memory cell capacitor having an input terminal connected to a first non-gate terminal of the memory cell transistor. The apparatus further comprises a sensor cell physically located in the row with the memory cells, wherein the sensor cell includes a sensor cell transistor and a sensor cell capacitor having an input terminal connected to a first non-gate terminal of the sensor cell transistor. Still further, the apparatus comprises a wordline extending from a row address decoder and connected to a gate of each memory cell transistor in the row and a gate of the sensor cell transistor in the row. The apparatus additionally comprises a sensor amplifier including a first input connected to the sensor cell at a point located between the first non-gate terminal of the sensor cell transistor and an input terminal of the sensor cell capacitor, a second input connected to a high voltage reference line, a third input connected to a low voltage reference line, and an output in communication with a row refresh circuit.

Some embodiments provide an apparatus comprising a dynamic random-access memory array including a plurality of memory cells physical arranged in rows, wherein each memory cell includes a memory cell transistor and a memory cell capacitor having an input terminal connected to a first non-gate terminal of the memory cell transistor. The apparatus further comprises a plurality of sensor cells, wherein each sensor cell is physically located in one of the rows of memory cells, and wherein each sensor cell includes a sensor cell transistor and a sensor cell capacitor having an input terminal connected to a first non-gate terminal of the sensor cell transistor. Still further, the apparatus comprises a plurality of wordlines including a wordline for each row of the memory cells, wherein the wordline for each row is connected to a gate of each memory cell transistor in the row and to a gate of each sensor cell transistor in the row. The apparatus additionally comprises a plurality of sensor amplifiers including a sensor amplifier for each sensor cell, wherein, for each sensor cell, the sensor amplifier for the sensor cell includes a first input connected to the sensor cell at a point between the first non-gate terminal of the sensor cell transistor and an input terminal of the sensor cell capacitor, a second input connected to a high voltage reference line, a third input connected to a low voltage reference line, and an output in communication with a row refresh circuit.

Some embodiments provide a method including performing a series of refresh cycles in a dynamic random-access memory (DRAM) array at a controlled refresh rate, wherein each refresh cycle includes a sequence of row refresh operations for a plurality of rows of memory cells in the DRAM array. The method further includes detecting whether a particular row of the memory cells has been exposed to more than a predetermined cumulative amount of electromagnetic disturbance since a most recent row refresh operation for the particular row of memory cells. Still further, the method includes decreasing an amount of time until performing a next row refresh operation for the particular row of memory cells in response to determining that the particular row of memory cells has been exposed to more than a predetermined cumulative amount of electromagnetic disturbance since the most recent periodic refreshing of the particular row of memory cells.

DETAILED DESCRIPTION

Figure 1:
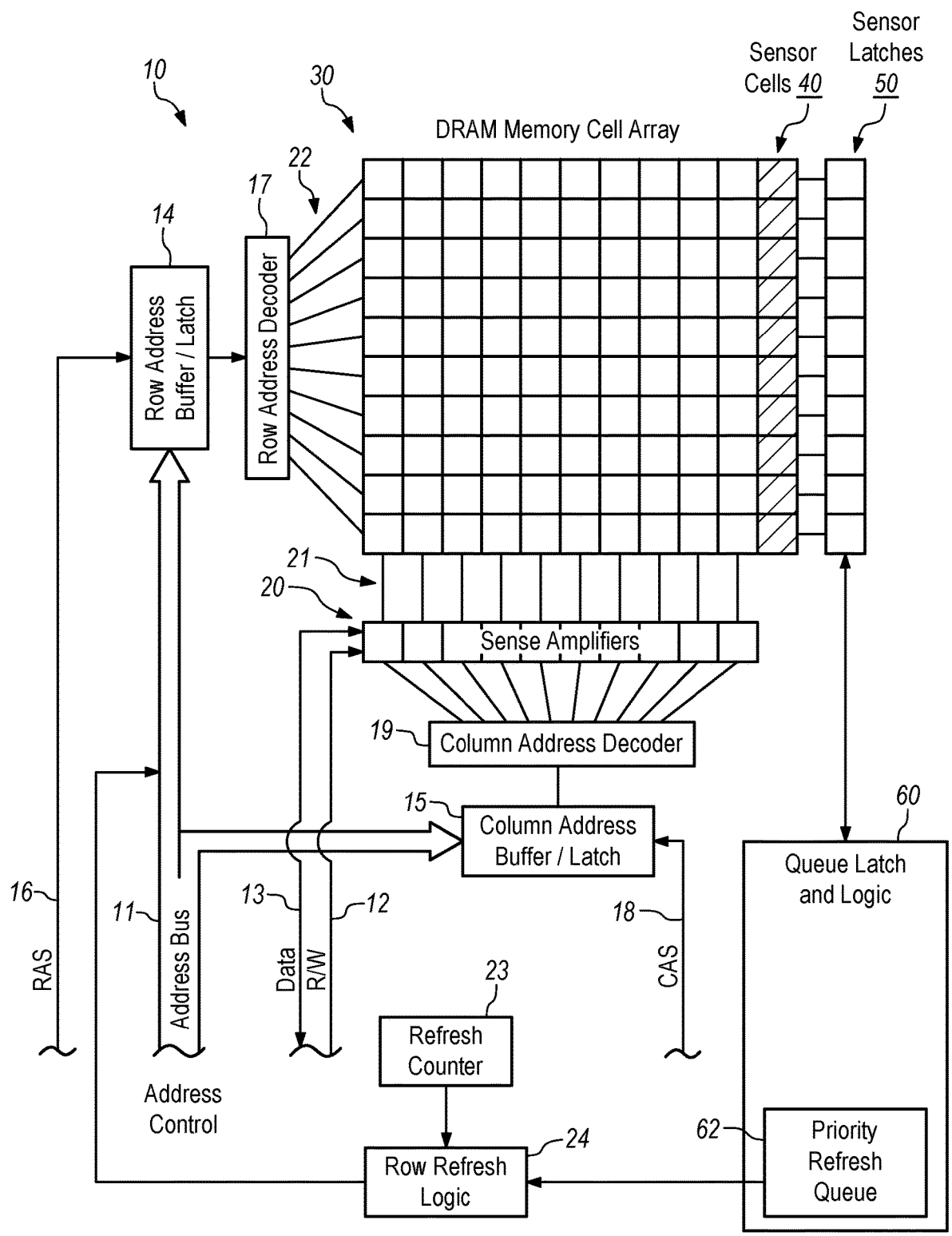
FIG. 1 is a diagram of a dynamic random-access memory (DRAM) device including sensor cells according to some embodiments.

Some embodiments provide an apparatus comprising a dynamic random-access memory array including a plurality of memory cells physical arranged in a row, wherein each of the memory cells includes a memory cell transistor and a memory cell capacitor having an input terminal connected to a first non-gate terminal of the memory cell transistor. The apparatus further comprises a sensor cell physically located in the row with the memory cells, wherein the sensor cell includes a sensor cell transistor and a sensor cell capacitor having an input terminal connected to a first non-gate terminal of the sensor cell transistor. Still further, the apparatus comprises a wordline extending from a row address decoder and connected to a gate of each memory cell transistor in the row and a gate of the sensor cell transistor in the row. The apparatus additionally comprises a sensor amplifier including a first input connected to the sensor cell at a point located between the first non-gate terminal of the sensor cell transistor and an input terminal of the sensor cell capacitor, a second input connected to a high voltage reference line, a third input connected to a low voltage reference line, and an output in communication with a row refresh circuit.

In some embodiments, each of the memory cells includes a second non-gate terminal to the memory cell transistor that is connected to a bitline for reading data from and writing data to the memory cell, and the sensor cell includes a second non-gate terminal to the sensor cell transistor that is connected to a pre-set voltage line. In one option, the apparatus may further include a first programmable voltage regulator for applying a first level of voltage to the high voltage reference line and a second programmable voltage regulator for applying a second level of voltage to the low voltage reference line, wherein the first level of voltage on the high voltage reference line is greater than a level of voltage on the pre-set voltage line, and wherein the second level of voltage on the low voltage reference line is less than the level of voltage on the pre-set voltage line.

Embodiments of the apparatus may further include a sensor latch circuit connected to the output of the sensor amplifier, and a queue latch circuit coupled to the sensor latch circuit by an interrupt line and a latched address bus. The queue latch circuit may cause the wordline to refresh each of the memory cells in the row and the sensor cell in the row in response to receiving a row address over the latched address bus that identifies the row that includes the wordline. The sensor latch in each row may store the row address that uniquely identifies the row to the row address decoder.

Some embodiments provide an apparatus comprising a dynamic random-access memory array including a plurality of memory cells physical arranged in rows, wherein each memory cell includes a memory cell transistor and a memory cell capacitor having an input terminal connected to a first non-gate terminal of the memory cell transistor and a second terminal connected to ground or a voltage source. The apparatus further comprises a plurality of sensor cells, wherein each sensor cell is physically located in one of the rows of memory cells, and wherein each sensor cell includes a sensor cell transistor and a sensor cell capacitor having an input terminal connected to a first non-gate terminal of the sensor cell transistor and a second terminal connected to ground or a voltage source. Still further, the apparatus comprises a plurality of wordlines including a wordline for each row of the memory cells, wherein the wordline for each row is connected to a gate of each memory cell transistor in the row and to a gate of each sensor cell transistor in the row. The apparatus additionally comprises a plurality of sensor amplifiers including a sensor amplifier for each sensor cell, wherein, for each sensor cell, the sensor amplifier for the sensor cell includes a first input connected to the sensor cell at a point between the first non-gate terminal of the sensor cell transistor and an input terminal of the sensor cell capacitor, a second input connected to a high voltage reference line, a third input connected to a low voltage reference line, and an output in communication with a row refresh circuit.

The transistors referred to herein are described as having a gate (i.e., a gate terminal) and two non-gate terminals. This specifically applies to field-effect transistors (FETs). Although some descriptions of a transistor may be described as having a gate terminal, source terminal and drain terminal, the transistor can have current flowing in either direction such that either non-gate terminal may be considered the drain terminal or the source terminal depending on the present direction of current flow. Accordingly, the term "non-gate terminals" is used herein to refer to the terminals of a transistor that may serve as source and/or drain terminals during operation of the transistor. For example, a voltage applied to the gate terminal will control the amount of conductivity between the two non-gate terminals. Depending upon the voltages at each of the two non-gate terminals, electrical current may flow through the transistor in either direction between the two non-gate terminals. In some embodiments, the non-gate terminal that is coupled to the capacitor (of a memory cell or a sensor cell) may be referred to as a first non-gate terminal. By contrast, the non-gate terminal that is coupled to a voltage line (i.e., either a pre-set voltage line for the sensor cell or a bitline for the memory cell) may be referred to as a second non-gate terminal.

In some embodiments, for each row of the dynamic random-access memory array, each of the memory cells in the row may include a second non-gate terminal to the memory cell transistor that is connected to a bitline for reading data from and writing data to the memory cell. Furthermore, for each row of the dynamic random-access memory array, each sensor cell in the row may include a second non-gate terminal to the sensor cell transistor that is connected to a pre-set voltage line. In one option, the apparatus may further include a first programmable voltage regulator for applying a first level of voltage to the high voltage reference line, and a second programmable voltage regulator for applying a second level of voltage to the low voltage reference line, wherein the first level of voltage on the high voltage reference line is greater than a level of voltage on the pre-set voltage line, and wherein the second level of voltage on the low voltage reference line is less than the level of voltage on the pre-set voltage line.

In some embodiments, the plurality of memory cells may be further arranged in columns, wherein, for each of the memory cells in one of the columns, the second non-gate terminal to the memory cell transistor of the memory cell is connected to a bitline for the column. Furthermore, the plurality of sensor cells may be further arranged in a column, wherein the second non-gate terminal to the sensor cell transistor of each of the sensor cells in the column is connected to the pre-set voltage line. Optionally, the apparatus may include a third programmable voltage regulator for applying the pre-set voltage to the pre-set voltage line.

Embodiments may include one or more sensor cells in one or more rows of memory cells in the dynamic random-access memory mat or array. It is not necessary for every row to include sensor cells or the same number of sensor cells. However, in one example, every row of the memory cells may include at least one of the sensor cells. In another example, every row of the memory cells may include more than one of the sensor cells. Where a row of memory cells includes more than one sensor cell and corresponding sensor amp, the sensor amps in a row may be daisy chained together.

In some embodiments of the apparatus, the row refresh circuit may include a plurality of sensor latch circuits and a row refresh queue connected to each of the sensor latch circuits by an interrupt line and a latched address bus. For each row of memory cells that includes at least one of the sensor cells, one of the sensor latch circuits may have an input coupled to (i.e., in communication with) the output of each sensor amplifier that is connected to at least one of the sensor cells included in the row or memory cells. The row refresh circuit may cause a refresh of each memory cell and each sensor cell in a particular row of the dynamic random-access memory array in response to receiving a row address over the latched address bus that identifies the particular row. In one option, the row refresh queue may include first-in, first-out storage for a plurality of row addresses received over the latched address bus. In another option, the apparatus may include a multiplexer for directing row refresh instructions to a row address decoder from a refresh counter and from the row refresh queue.

Some embodiments provide a method including performing a series of refresh cycles in a dynamic random-access memory (DRAM) array at a controlled refresh rate, wherein each refresh cycle includes a sequence of row refresh operations for a plurality of rows of memory cells in the DRAM array. The method further includes detecting whether a particular row of the memory cells has been exposed to more than a predetermined cumulative amount of electromagnetic disturbance since a most recent row refresh operation for the particular row of memory cells. Still further, the method includes decreasing an amount of time until performing a next row refresh operation for the particular row of memory cells in response to determining that the particular row of memory cells has been exposed to more than a predetermined cumulative amount of electromagnetic disturbance since the most recent periodic refreshing of the particular row of memory cells. In one option, the step or operation of decreasing an amount of time until performing a next row refresh operation for the particular row of memory cells may include refreshing the particular row of memory cells prior to a next refresh cycle. In another option, the step or operation of decreasing an amount of time until performing a next row refresh operation for the particular row of memory cells may include refreshing the particular row of memory cells earlier in the sequence of row refresh operations of the next refresh cycle. In yet another option, the step or operation of decreasing an amount of time until performing a next row refresh operation for the particular row of memory cells may include increasing the controlled refresh rate for the DRAM array.

In some embodiments of the method, the operation of detecting whether the particular row of memory cells has been exposed to more than a predetermined cumulative amount of electromagnetic disturbance between the regular periodic refreshes may include the use of a sensor cell. For example, the method may include detecting a voltage of a sensor cell that is physically located in the particular row of memory cells and comparing the detected voltage to a high voltage reference and a low voltage reference. Accordingly, the particular row of memory cells is determined to have been exposed to more than a predetermined cumulative amount of electromagnetic disturbance in response to the detected voltage of the sensor cell being greater than the high voltage reference or less than the low voltage reference.

Embodiments of the method may include the use or implementation of any element of the apparatus embodiments disclosed herein. For example, in some embodiments of the method, the sensor cell may include a sensor cell transistor and a sensor cell capacitor having an input terminal connected to a first non-gate terminal of the sensor cell transistor, wherein the voltage of the sensor cell is detected at a point between the first non-gate terminal of the sensor cell transistor and an input terminal of the sensor cell capacitor. Still further, the method may include charging the sensor cell to a pre-set voltage during each refresh of the particular row of memory cells including the sensor cell.

Some embodiments are suitable to address rowhammer attacks through a new design for dynamic random-access memory (DRAM) devices. DRAM devices are memory devices made with arrays of capacitor memory cells accessed through rows (wordlines) and columns (bitlines). Rowhammer attacks can cause errors in the memory cells of DRAM devices that happen to be most vulnerable due to process variations and other manufacturing factors. Embodiments herein may add sensor cells (also referred to herein as "scells") in the DRAM memory array rows, wherein the sensor cells may be physically located within the memory cell arrays. The sensor cells may be positioned throughout the DRAM array, sub-arrays, tiles and/or banks of memory. For example, one or more of the sensor cells may be included in each row of memory cells in a DRAM device, or at least those portions of the DRAM device to be protected from various electromagnetic disturbances, such as those disturbances caused by a rowhammer attack. The charge loss or charge gain experienced by capacitive sensor cells is affected by electromagnetic disturbances in the same or substantially similar manner as the capacitive memory cells. However, the voltage changes in DRAM components and elements occurring during a rowhammer attack may cause electromagnetic disturbances over a very limited distance within the DRAM device, such as the distance between immediately adjacent memory cells and wordlines. Accordingly, the ability to detect a rowhammer attack prior to any of the memory cells experiencing a bit flip on any one row of memory cells depends upon having a sensor cell close enough to the potential victim memory cells to detect a disturbance before the disturbance can cause a bit flip of a memory cell.

Embodiments of the DRAM mat or array may vary in size. In one non-limiting example, a DRAM mat may include 512 rows of memory cells. Such a DRAM mat with 512 rows of memory cells may be addressed using a 9-bit row address (i.e., $2^9$=512). The number of bits in a row address may be adjusted to accommodate the number of memory cell rows in a particular DRAM mat or array. Embodiments described herein are not limited to any particular size of DRAM mat or array, but may be described in terms of a 9 bit row address for sake of convenience. Furthermore, the number of memory cells in a row of the DRAM mat is not limited and may be any standard or non-standard number of memory cells wherein each memory cell may store one bit of data.

In some embodiments, the sensor cells may be positioned directly adjacent to memory cells in adjacent bitlines and may be connected within a memory array in a manner and spacing that is similar to the memory cells within the array, thereby enabling the sensor cells to be included in any or all rows within any or all memory arrays in the DRAM. In a non-limiting example, embodiments of a DRAM device may include at least one sensor cell for each row in a memory cell array. In one option, a DRAM device may include one sensor cell at one end of each row in the memory cell array. In another option, a DRAM device may include three sensor cells spaced across each row with each sensor cell located between two of the memory cells in the row. Other numbers and arrangements of sensor cells may also be implemented without limitation. Since the sensor cells are physically spaced or distributed across the memory cell array and include similar transistor and capacitor structures, the manufacturing of the sensor cells will experience the same manufacturing process conditions and variations as the memory cells in the same row. Therefore, any manufacturing-induced deviation in the capacity of the memory cells to hold a charge and/or resist a rowhammer attack is expected to be proportionally experienced by the sensor cells in the same row or region of the memory cell array.

Embodiments include memory cells and sensor cells that are in the same row and connected to the same wordline, such that the sensor cells may be refreshed every time that the memory cells in the same row are refreshed, such as at a predetermined periodic refresh rate or frequency (which may, for example, be every 64 milliseconds or 32 milliseconds without limitation). When a row is refreshed, read or written, the sensor cell capacitors may be charged to pre-set voltage. Optionally, the pre-set voltage may be controlled by a programmable voltage regulator supplying voltage to the pre-set voltage line. Although the memory cells and sensor cells are connected to the same wordline and are refreshed at the same time, the sensor cells do not store data and are not connected to a bitline.

In some embodiments, the sensor cells may be designed to different specifications than the memory cells, such as a sensor cell capacitor having a different capacitance or other parameter than the memory cell capacitor. For example, a sensor cell having a capacitor with less capacitance than the capacitor of the memory cells may be more susceptible to charge loss. While susceptibility to charge loss may be undesirable for a memory cell, a sensor cell that has slightly greater susceptibility to charge loss may be well suited to detect rowhammer attacks since such a sensor cell may, when a row of memory cells is subjected to an electromagnetic disturbance such as that of a rowhammer attack, be expected to exhibit a voltage change before an adjacent memory cell would exhibit a similar voltage change and/or approach the point of experiencing a bit flip. Accordingly, the sensor cell may be designed to be more sensitive to a rowhammer attack than the memory cells that are being protected against the rowhammer attack. The memory cells and the sensor cells may be formed on the same substrate using the same material under the same conditions and operating environment. In certain specific non-limiting examples, the capacitance of one or more sensor cell may be caused to be different than the capacitance of the memory cells by changing the geometry of the sensor cell, by changing the proximity of the coupling material, or changing some other aspect of the sensor cell.

During a row refresh, the sensor cell capacitor is charged to a pre-set voltage when the wordline activates the sensor cell transistor gate to turn on so that the sensor cell capacitor is connected to the voltage on the pre-set voltage line. Once the sensor cell capacitor has been pre-set to the predetermined pre-set voltage value, the sensor amplifier ("sensor amp") connected to the sensor cell is then able to sense a subsequent charge loss or charge gain (i.e., voltage loss or voltage gain) in the capacitor. Specifically, the sensor amplifier has an input connected to the sensor cell at a point between the first non-gate terminal of the transistor and the capacitor input terminal. A sense high voltage line (i.e., high voltage reference) and a sense low voltage line (i.e., low voltage reference) are each connected to separate inputs of the sensor amplifier to establish trigger points for the sensor amplifier. The sense high voltage and the sense low voltage may be constant voltages or adjustable voltages. For example, the sense high voltage may be applied to the sense high voltage line by a first programmable voltage regulator and the sense low voltage may be applied to the sense low voltage line by a second programmable voltage regulator.

In some embodiments, the sensor amplifier may be formed by two comparators and an OR logic gate. For example, the sensor amplifier may include a first comparator having a first input connected to the sensor cell and a second input connected to the high voltage reference line, and a second comparator having a first input connected to the sensor cell and a second input connected to the low voltage reference line. The outputs from the first and second comparators are connected to the inputs of the OR logic gate. Accordingly, the sensor amplifier output may indicate whether the voltage at the input terminal of the capacitor in the sensor cell is outside of a voltage range established by the low and high voltage reference lines. There is preferably a one-to-one correspondence between sensor amplifiers and sensor cells, wherein each sensor cell is directly connected to a sensor amplifier. While the outputs of the sensor amplifiers may be combined before being connected to the TRIG input of the sensor latch, there is preferably a sensor amplifier for each sensor cell.

In some embodiments, the sensor latch circuit may include an arm (ARM) input connected to the wordline for the row. Accordingly, every activation of the wordline (ROW WL) may have the dual effect of charging the sensor cell capacitors in the row and enabling (or "arming") the sensor latch to receive and latch a subsequent trigger (TRIG) input from any of the sensor amplifiers in the row. Specifically, the wordline for the row is activated by a row address decoder in response to a read instruction directed at the row address, a write instruction directed at the row address, and/or a refresh instruction directed at the row address from the row refresh circuit or logic. As discussed elsewhere herein, the row addresses in a series of refresh instructions may come from both a refresh counter and the priority refresh queue. In one option, the sensor latch may become armed in response to the falling edge of the wordline (i.e., the de-assertion of an asserted wordline). Arming the sensor latch at the falling edge of the wordline signal may be beneficial since the sensor cell capacitor will have had time to charge to the pre-set voltage during the period that the wordline was active.

Between sequential activations of the wordline which refreshes the sensor cell capacitor and arms the sensor latch, the sensor amplifier monitors the voltage of the sensor cell capacitor at a point between the first non-gate terminal of the transistor and the capacitor input terminal. If the monitored voltage of the sensor cell capacitor becomes greater than the voltage on the sense high voltage line or lower than the voltage on the sense low voltage line, then the sensor amplifier produces an output signal to the sensor latch in the same row as the affected sensor cell and the sensor amplifier. The output from the sensor amplifier is connected to a trigger (TRIG) input of the sensor latch. Furthermore, if there is more than one sensor amplifier physically located in the same row of memory cells, the sensor amplifiers may be daisy chained together so that there is only one trigger (TRIG) input to the sensor latch and an output signal from any of the daisy chained sensor amplifiers in the row will be provided to the trigger input of the sensor latch. In one option, the sensor amplifiers in the same row may be daisy chained together in a series from at first sensor amplifier closest to a first end of the row to the last sensor amplifier closest to a second end of the row where the output of the last sensor amplifier is connected to the trigger (TRIG) input of the sensor latch circuit that may be located at the second end of the row of memory cells and sensor cells. Beneficially, daisy chaining of multiple sensor amplifiers on the same row reduces the number of conductive traces that must extended across the DRAM mat or array. It should also be noted that if the monitored voltage of the sensor cell capacitor stays within the voltage range defined by the high voltage reference and the low voltage reference until the next refresh, then the sensor amplifier connected to the sensor cell will not produce an output to the sensor latch. In the absence of output from a sensor amplifier during a given refresh cycle, the sensor latch remains ready or armed to latch should the sensor amplifier produce an output to the sensor latch trigger (TRIG) input during a subsequent refresh cycle.

If the sensor latch receives a trigger (TRIG) input while armed, the sensor latch will "latch" in the sense that the sensor latch will ignore any further trigger (TRIG) input from the sensor amplifier(s) until receiving a subsequent arm (ARM) signal via the wordline activation. Simultaneous with or subsequent to latching, the sensor latch that receives a trigger (TRIG) input while armed will wait to receiving a synchronization (SYNC) signal from the queue latch on a synchronization bus connected to all of the sensor latches in a memory mat or array. After receiving the assertion of the synchronization signal, the sensor latch will then wait for a brief period of time, such as a predetermined period of time, before attempting to assert an interrupt (INT) on the interrupt bus. The synchronization (SYNC) signal may be a supervisor clock, such as a periodically asserted signal, that enables the sensor latches to coordinate assertion and de-assertion on the interrupt bus and the address bus to prevent bus contention or race conditions. For example, each sensor latch in a given memory cell mat or array may be individually delayed by an incrementally increasing pre-determined time period after activation of the synchronization (SYNC) bus to ensure that only one sensor latch at a time can assert INT and a row address. In other words, each sensor latch in the memory cell mat or array may have a unique predetermined delay period following receipt of the SYNC signal before that sensor latch can assert an interrupt (INT) signal on the interrupt bus and output a row address on the address bus.

If the sensor latch detects that the interrupt bus is currently being asserted by another sensor latch when the given sensor latch has been latched and reaches the end of its predetermined delay period, then the given sensor latch will wait for the next the synchronization (SYNC) signal to be asserted, wait for the predetermined delay period, and again determine whether the interrupt bus is being asserted by another sensor latch. If multiple other sensor latches are keeping the interrupt bus busy, the given sensor latch may have to perform multiple waiting periods before finding that the interrupt bus is available (i.e., not asserted by another sensor latch).

If the sensor latch that has received the trigger (TRIG), latched, received a synchronization (SYNC) signal on the synchronization bus, waited for the predetermined time period following the SYNC signal, and detects no interrupt (INT) signal on the interrupt bus, then the sensor latch may assert its own interrupt (INT) signal on the interrupt bus. While this sensor latch continues to assert the interrupt (INT) signal on the interrupt bus, every other sensor latch in the DRAM mat or array is prevented from asserting an interrupt. The sensor latch having its interrupt (INT) asserted on the interrupt bus may then send a row address (such as a 9-bit row address for a 512 row DRAM mat) on the latched address bus.

Embodiments include a queue latch and logic circuit (hereinafter "queue latch circuit") that is coupled to the interrupt bus, the latched address bus, and the synchronization bus. When the queue latch circuit has asserted a synchronization (SYNC) signal on the synchronization bus and subsequently receives a new interrupt (INT) signal on the interrupt bus, the queue latch circuit is enabled to receive and store a row address via the latched address bus. After the row address has been received by the queue latch circuit and has been stored in the priority refresh queue, the queue latch circuit may de-assert the synchronization (SYNC) signal on the synchronization bus indicating an acknowledgement that the row address has been successfully receive and stored. In response to the de-assertion of the synchronization (SYNC) signal, the sensor latch that has been asserting the interrupt (INT) signal will de-assert the interrupt signal and the latched row address. The sensor latch has then completed the reporting of the disturbance occurring in its row of the memory array, and is inactive until the wordline for the row is subsequently asserted.

After the queue latch circuit receives a row address identifying a row having a triggered sensor latch, the queue latch circuit loads the row address into a priority refresh queue. As one non-limiting example, the priority refresh queue may operate on a first-in, first-out (FIFO) basis to provide row addresses to the refresh circuits of the DRAM on a priority basis. This priority refresh queue may be multiplexed with the addresses generated by the refresh counter in a DRAM. When one or more row addresses are detected as being stored in the priority refresh queue, then row refresh cycles may alternate between the next row address from the refresh counter and the next row address in the priority refresh queue until it is empty. The priority refresh queue may include storage for any one or more row addresses, but preferably includes storage for at least eight row addresses. If the priority refresh queue gets closer to full (i.e., a certain percentage full or number of row addresses occupied), the DRAM can let host system know to pause or slow operations so that the DRAM may perform more refresh cycles to empty the queue. In one option, the queue latch circuit may send a pause or slow operations signal or request to the host system. When the refresh queue is at least half full with row addresses in need of a priority refresh, the refresh circuit may perform refresh cycles using row addresses that are taken from both the refresh counter and the refresh queue. For example, the refresh circuit may alternate between a row address from the refresh counter and a row address from the refresh queue. In a further option, the ratio of row addresses taken from the refresh counter and row addresses taken from the refresh queue may be fixed or variable, such as 1:1 during periods that the refresh queue contains one or more row address, prioritizing all row addresses from the refresh queue above the row addresses from the refresh counter or as a function of a backlog of row addresses in the refresh queue.

The described embodiment of the sensor latches and the queue latch circuit provide for each row experiencing a disturbance to be detected and refreshed without loss of any row address that requires a priority refresh. However, embodiments may include other circuits and/or processes for latching each row in response to a sensor amp trigger, populating the address location of that row into a queue, and then resetting the latch when the row has been refreshed and the sensor cell capacitor has been charged to a pre-set nominal voltage state.

As describe above, the assertion of the wordline will charge the sensor cell capacitor to the pre-set voltage and arm (enable) the sensor latch to receive any subsequent trigger (TRIG) signal from the sensor amplifier(s) in the row. It should be appreciated that the wordline may be asserted for various reasons, such as a read or write instruction directed by the central processor to the row address associated with the wordline, a refresh instruction directed by the row refresh logic circuit to the row address associated with the wordline as a result of the refresh counter, and/or a refresh instruction directed by the row refresh logic circuit to the row address associated with the wordline as a result of the priority refresh queue maintained by the queue latch circuit. Any of these events will refresh the sensor cell and arm the sensor latch. It is possible that a given wordline will be refreshed for any or all of these events over time. However, embodiments preferably cause a prompt activation of a wordline as a result of a refresh instruction directed by the row refresh logic circuit that includes a row address taken from the priority refresh queue.

While a read or write instruction may not be directed to the row address until a process run by the central processor needs to read or write data to the row, and while the refresh counter issues refresh instructions on a periodic basis to avoid loss of data in the memory cells, a refresh instruction formed by the row refresh logic circuit using a row address taken from the priority refresh queue should be prioritized to occur in a shorter time period that waiting on the periodic refresh instruction issued by the refresh counter. In other words, any row having its row address stored in the priority refresh queue should be promptly refreshed outside of the regular refresh cycles triggered by the refresh counter. Still, the refresh counter may continue to perform periodic refreshes of each row in the DRAM array alongside the priority refreshes of rows identified in the priority refresh queue as having experience a disturbance in a sensor cell.

In some embodiments, the row addresses stored in the priority refresh queue may be processed in the order received (i.e., first-in, first-out). So, in turn, each row that has triggered a priority row refresh will be refreshed. When the row with the triggered sensor latch is refreshed by the row refresh circuit activating the wordline for the row, the charge (voltage) stored by the sensor cell is returned to the default level established by the programmable voltage regulator connected to the pre-set voltage line. Since the voltage of the programmable voltage regulator is between the high voltage reference (sense high V) and the low voltage reference (sense low V), the sensor cell capacitor will store a voltage that is also between the high and low voltage references. Upon refresh, the sensor amplifier connected to the sensor cell will no longer output a trigger signal to the sensor latch. Once the sensor amplifier output is no longer outputting a trigger signal to the sensor latch and the wordline applies a signal to the ARM input to the sensor latch, the sensor latch will be enabled to latch in response to a subsequent triggering event from the sensor amplifier.

In some embodiments, activation of the wordline causes the gate of the transistor within the sensor cell to turn on such that the pre-set voltage on a pre-set voltage line from a programmable voltage regulator is applied to the sensor cell capacitor to charge the sensor cell capacitor. In one non-limiting example, the pre-set voltage may be set to Vdd/2, or about the same voltage as a typical bitline pre-charge voltage that is applied to the memory cells prior to being read. In a further option, the voltage on the pre-set voltage line to the sensor cells may be supplied by the same voltage regulator that supplies a pre-charge voltage to the bitlines connected to the memory cells or may be supplied by some other voltage regulator, such as a dedicated programmable voltage regulator. Any amount of charge loss or gain (i.e., voltage decrease or increase) that the sensor cell capacitor has experienced prior to a refresh is eliminated when the sensor cell capacitor is returned to the pre-set voltage during a refresh. In one option, the voltage on the pre-set voltage line may be continuously supplied a fixed voltage during operation of the DRAM. However, in another option, the level of voltage provided from the programmable voltage regulator to the pre-set voltage line may be periodically changed, such as during manufacturing, power-on, or during a periodic recalibration of the programmable voltage regulator.

Embodiments provide the technical advantage of being able to detect electromagnetic disturbances emanating from neighboring devices and circuits within the DRAM mat or array, then identify the rows that should be refreshed before the electromagnetic disturbances are able to cause a bit flip in the memory cells in the identified row. In this manner, a rowhammer attack is effectively prevented by promptly refreshing affected rows, thereby stopping or reversing the cumulative effect of the electromagnetic disturbance on the memory cells before the electromagnetic disturbance has opportunity to inject errors in the data stored in the memory cells and readable by the host system.

FIG. 1 is a diagram of a dynamic random-access memory (DRAM) device 10 including sensor cells 40 according to some embodiments. The DRAM device 10 includes a plurality of memory cells 30 physical arranged in rows and columns. An address bus 11 may carry a memory address that is to be read or written. A read/write (R/W) line 12 may carry a signal indicating whether the address on the memory address bus 11 is to be subject of a read operation or a write option. A data line 13 may carry data to and/or from the memory cells corresponding to the address on the memory address bus 11.

The address bus 11 may be split such that a first portion of the address is used as a row address that is directed to a row address buffer/latch 14 and a second portion of the address is used as a column address that is directed to a column address buffer/latch 15. A row address strobe (RAS) line 16 is directed to the row address buffer/latch 14, where activation of the RAS line 16 causes the row address in the row address buffer/latch 14 to be loaded into the row address decoder 17. The row address decoder 17 then uses the row address to activate one of the wordlines 22 connected to a row of the DRAM array that is uniquely associated with the row address. Similarly, a column address strobe (CAS) line 18 is directed to the column address buffer/latch 15, where activation of the CAS line 18 causes the column address in the column address buffer/latch 15 to be loaded into the column address decoder 19. The column address decoder 19 then uses the column address, or range of column addresses, to read data from the sense amplifiers 20 that are connected to the DRAM array via bitlines 21. The individual memory cells in the DRAM array 30 are illustrated as blocks for simplicity.

The DRAM device 10 of FIG. 1 further includes the plurality of sensor cells 40, where each sensor cell is illustrated as a block (with cross-hatching) physically located at the end of each row of the memory cells 30. The individual wordlines 22 are connected to the memory cells 30 in the row and also to the sensor cell(s) 40 in the row. Each of the sensor cells 40 is in communication with a sensor amplifier (not shown; see FIG. 4) having an output connected to one of the sensor latches 50. The sensor latches 50 may include one sensor latch for each row that includes a sensor cell. Furthermore, the sensor latches 50 may be conveniently located at the end of the row of memory cells 30 and sensor cells 40.

When one of the sensor cells 40 detects an electromagnetic disturbance, the associated sensor amplifier (not shown) provides a trigger signal to the one of the sensor latches 50 that is on the same row as the sensor cell providing the trigger signal. The particular sensor latch 50 subsequently provides the row address for that same row to the queue latch and logic ("queue latch") circuit 60. The queue latch circuit 60 maintains a priority refresh queue 62 for buffering row addresses that require a prompt refresh.

The rows of memory cells in the DRAM array 30 are typically refreshed at a predetermined refresh rate as controlled by a refresh counter 23. However, in order to accommodate both the periodic refreshes controlled by the refresh counter 23 and the priority refreshes identified in the refresh queue 62, a refresh row logic circuit 24 may be included. The refresh row logic circuit 24 may direct row addresses from both the refresh counter 23 and the refresh queue 62 to the row address buffer/latch 14 via the address bus 11. For example, the refresh row logic circuit 24 may include a multiplexer that receives row addresses from both the refresh counter 23 and the refresh queue 62 and places those row addresses on the address bus 11 to the row address buffer/latch 14 as required. Depending upon whether or not there are any row addresses buffered in the refresh queue 62, and perhaps also how many row addresses are buffered in the refresh queue 62 at any given moment, the refresh row logic circuit 24 may control how the row addresses are prioritized. Embodiments preferably handle the row address in the priority refresh queue 62 on an expedited basis so that those rows are refreshed before any further electromagnetic disturbance can cause, or reach the potential to cause, a bit flip in a memory cell within that row. Furthermore, the refresh queue may buffer its row addresses in a manner that forms a first-in first-out (FIFO) queue.

Figure 2:
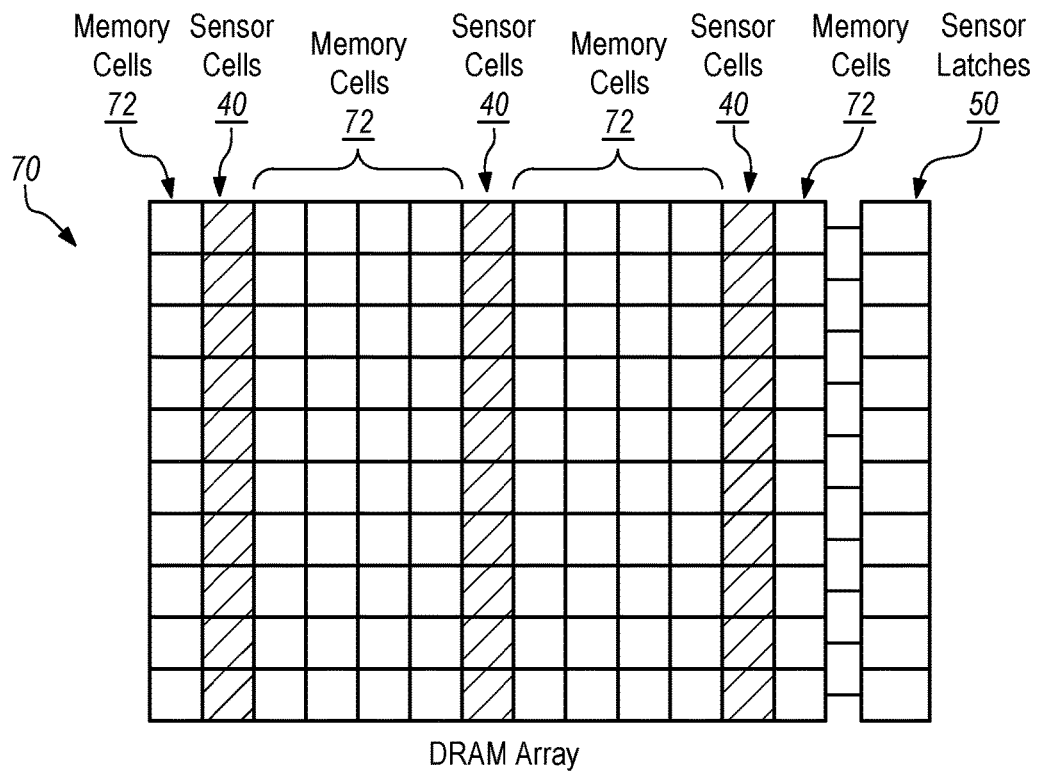
FIG. 2 is a diagram of a DRAM memory cell array of a DRAM device having multiple sensor cells in each row of memory cells.

FIG. 2 is a diagram of a DRAM memory cell array 70 of a DRAM device having multiple sensor cells 40 in each row of memory cells 72. In the illustrated embodiment, each row of the DRAM memory cell array 70 has the same arrangement of memory cells 72 and sensor cells 40. Specifically, in the illustrated embodiment, each row (horizontal) has a series of cells including a memory cell 72, a sensor cell 40, four memory cells 72, a sensor cell 40, four memory cells 72, a sensor cell 40, and a memory cell 72. As in FIG. 1, the end of each row includes a sensor latch 50. Other features and aspect of a DRAM device are not repeated from FIG. 1.

Notice that there are the same number of memory cells in each row of the DRAM array 30 of FIG. 1 and the DRAM array of FIG. 2. Accordingly, these DRAM memory cells may be accessed in the same manner using the same addresses. The only difference between the two embodiments of DRAM arrays is the number and location of the sensor cells 40, which does not affect the operation of the DRAM array other than providing protection against a rowhammer attack. However, the greater number of sensor cells 40 and the more disperse physical locations of the sensor cells 40 in DRAM array 70 of FIG. 2, relative to the DRAM array 30 of FIG. 1, provides more opportunities to sense an electromagnetic disturbance in a row of the memory cells and may provide a greater degree of protection against a rowhammer attack. The tradeoff is that the greater number of sensor cells 40 will use more of the available area on the DRAM device.

Figure 3:
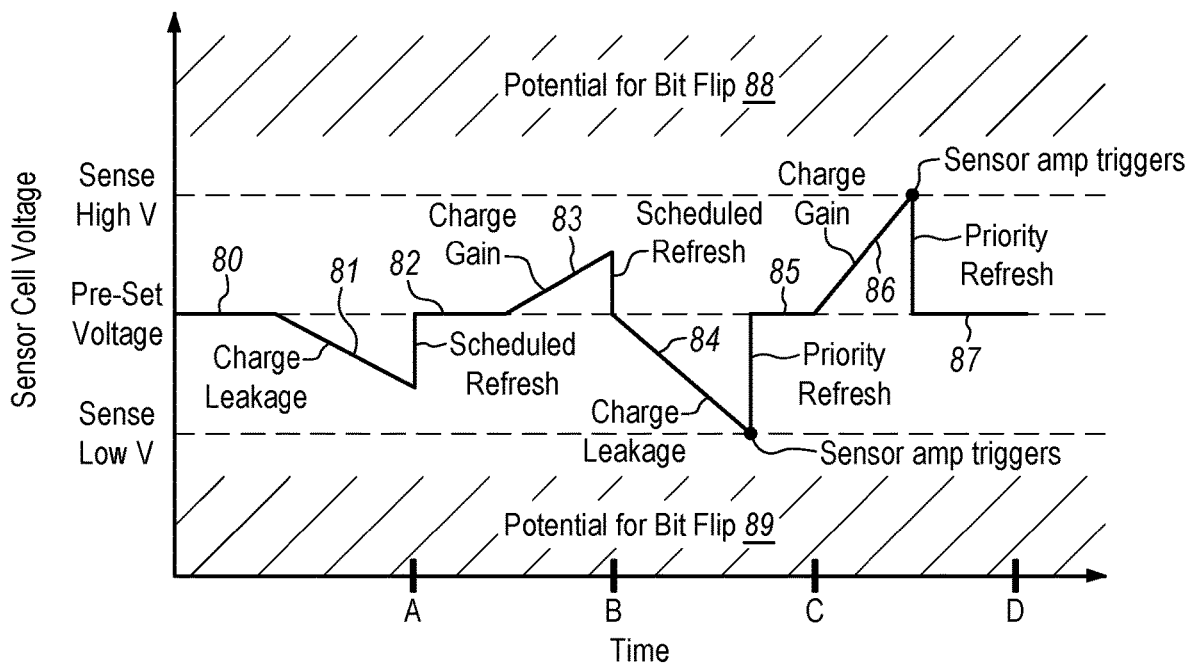
FIG. 3 is a diagram of hypothetical changes in sensor cell voltage over time.

FIG. 3 is a graph of hypothetical changes in sensor cell voltage over time. The graph plots sensor cell voltage (on the Y-axis) as a function of time (on the X-axis). The Y-axis is labeled with three voltages. The pre-set voltage is the voltage on the pre-set voltage line that is used to charge the sensor cell capacitors during a refresh. The sense high voltage is the high voltage reference that a voltage regulator establishes on a high voltage reference line. Similarly, the sense low voltage is the low voltage reference that a voltage regulator establishes on a low voltage reference line. After the sensor cell capacitor is charged to the pre-set voltage, the sensor cell capacitor may lose or gain charge over time resulting in a reduction or increase in the voltage of the sensor cell capacitor. If the sensor cell capacitor voltage remains between the high and low voltage values (see upper and lower dashed horizontal lines) between periodic (scheduled) refresh cycles, then the row containing the sensor cell will be refreshes only at the predetermined refresh rate. The periodic refresh cycles generated by the refresh counter are illustrated by a series of four, evenly-spaced tick-marks (A-D) on the X-axis.

Beginning at the left side of the graph and moving to the right with time, the sensor cell voltage at period 80 is equal to the pre-set voltage due to a refresh. The sensor cell voltage at period 81 is in decline due to charge loss from the sensor cell capacitor. However, the sensor cell voltage does not fall below the sensor low voltage reference before the next refresh at time A. So, the periodic refresh A returns the sensor cell voltage to the pre-set voltage. During period 82, the sensor cell voltage remains at the pre-set voltage. The period 83 shows a charge gain as an increase in the sensor cell voltage, but the voltage does not rise above the sensor high voltage reference before the next refresh at time B. So, the periodic refresh B returns the sensor cell voltage to the pre-set voltage.

During period 84 the sensor cell voltage drops below the sensor low voltage reference before the next refresh at time C. Accordingly, the sensor amplifier connected to the sensor cell will output a trigger signal that is used to request a priority refresh of the row where the triggered sensor latch is located. When the row address for the row is processed through the refresh row circuit, the sensor cell(s) and memory cells in that row are promptly refreshed. In this illustration, the sensor cell has been refreshed to the pre-set voltage at period 85 prior to the next periodic refresh at time C. Note that the periodic refresh at time C may still occur.

During period 86 the sensor cell voltage rises above the sensor high voltage reference before the next refresh at time D. Accordingly, the sensor amplifier connected to the sensor cell will output a trigger signal that is used to request a priority refresh of the row where the triggered sensor latch is located. When the row address for the row is processed through the refresh row circuit, the sensor cell(s) and memory cells in that row are promptly refreshed. In this illustration, the sensor cell has been refreshed to the pre-set voltage at period 87 prior to the next periodic refresh at time D. Note that the periodic refresh at time D may still occur.

It is a technical advantage of the foregoing process that changes in the sensor cell voltage either above the sense high voltage reference or below the sense low voltage reference are detected and trigger a refresh of the row. The sense high and low voltage references may be selected and/or the sensor cell capacitor may be designed so that the sensor latch for the row will be triggered under conditions of an electromagnetic disturbance that will not yet induce a bit flip in one of the memory cells in the same row. In other words, the sensor amplifiers connected to the sensor cells should detect conditions that are more sensitive to an electromagnetic disturbance than are the memory cells themselves. As a result, the affected row of memory cells and sensor cells may receive a priority refresh (see "sense amp triggers") before the conditions can induce a bit flip in any of the memory cells in the row. For example, the area 88 may represent conditions under which a memory cell might experience a bit flip due to charge gain (voltage increase) and the area 89 may represent conditions under which a memory cell might experience a bit flip due to charge loss (voltage drop). Applying the methodology of the described embodiments, the sensor cell voltage never reaches area 88 or area 89 where there is potential for a bit flip.

Figure 4:
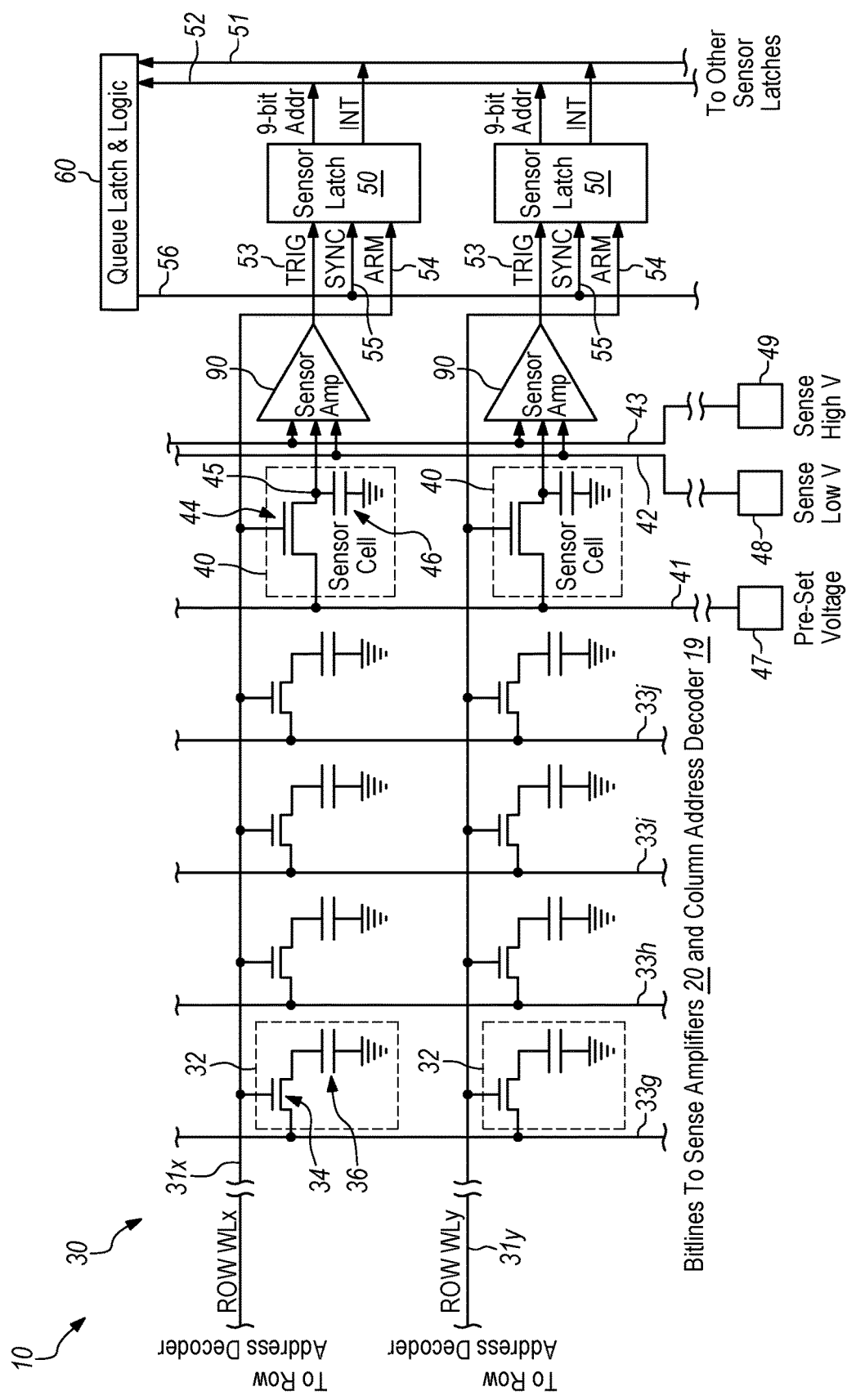
FIG. 4 is a diagram of a portion of two rows of a DRAM array that both include a sensor cell, a sensor amplifier and a sensor latch according to some embodiments.

FIG. 4 is a diagram of a portion of the DRAM device 10 including two rows of a DRAM memory array 30, wherein both rows include memory cells 32, a sensor cell 40, a sensor amplifier 90 and a sensor latch 50 according to some embodiments. The DRAM memory array 30 is laid out in rows (left and right in FIG. 4) and columns (up and down in FIG. 4). Each row has a single wordline, such as a first wordline 31*x* (ROW WLx) in the first row shown and a second wordline 31*y* (ROW WLy) in the second row shown. There may be further rows above and/or below the two rows illustrated. The two rows illustrated may also include additional memory cells 32 and/or sensor cells 40.

The illustrated embodiment includes multiple columns of memory cells 32 and one column of sensor cells 40. Each column of memory cells 32 has a single bitline, such as one of the bitlines 33*g*-33*j*. An additional bitline would be included for each additional column of memory cells 32 in the memory array 30. The column of sensor cells 40 has a single pre-set voltage line 41.

Each memory cell 32 includes a memory cell transistor 34 and a memory cell capacitor 36 having an input terminal connected to a first non-gate terminal of the memory cell transistor and a second terminal connected to ground. Similarly, each sensor cell 40 includes a sensor cell transistor 44 and a sensor cell capacitor 46 having an input terminal connected to a first non-gate terminal of the sensor cell transistor at point 45 and a second terminal connected to ground. For any row in the memory array 30, the wordline 31 extends from the row address decoder 17 (see FIG. 1) and is connected to a gate of each memory cell transistor 34 in the row and a gate of the sensor cell transistor 44 in the row. The wordline 31 of each row is further connected to an arm (ARM) input to the sensor latch 50 for the same row. Accordingly, when the wordline 31 for a given row is activated, the gate of each memory cell transistor 34 in the row is turned on, and the gate of the sensor cell transistor 44 is turned on. Turning on the gate of a memory cell transistor 34 connects the memory cell capacitor 36 to the bitline 33 for the column in which the memory cell 32 resides. Turning on the gate of a sensor cell transistor 44 connects the sensor cell capacitor 46 to the pre-set voltage line 41 for the column of sensor cells. When the wordline 31 for the given row is deactivated, the sensor latch 50 for the row is armed.

A plurality of sensor amplifiers 90 are also provided. Each sensor amplifier 90 includes a first input connected to the sensor cell at the point 45 between the first non-gate terminal of the sensor cell transistor 44 and an input terminal of the sensor cell capacitor 46. Each sensor amplifier 90 further includes a second input connected to the low voltage reference line 42 and a third input connected to the high voltage reference line 43. A non-limited example of the sensor amplifier is described in further detail in reference to FIG. 8, below. The sensor amplifier 90 has an output in communication with a trigger (TRIG) input of the sensor latch 50.

A first programmable voltage regulator 47 may apply a pre-set voltage to the pre-set voltage line 41, a second programmable voltage regulator 48 may apply a second level of voltage to the low voltage reference line 42, and a third programmable voltage regulator 49 may apply a third level of voltage to the high voltage reference line 43. The voltage on the high voltage reference line 43 should be greater than a level of voltage on the pre-set voltage line 41, and the voltage on the low voltage reference line 42 should be less than the level of voltage on the pre-set voltage line 41.

The DRAM device 10 further includes a plurality of sensor latch circuits 50 and a queue latch circuit 60 connected to each of the sensor latch circuits 50 by an interrupt line 51 and a latched address bus 52. For each row of memory cells 32 that includes at least one of the sensor cells 40, one of the sensor latch circuits 50 may have a trigger (TRIG) input 53 coupled to (i.e., in communication with) the output of each sensor amplifier 90 that is connected to at least one of the sensor cells 40 included in the row. The sensor latch 50 also has an arm (ARM) input 54 coupled to the wordline 31 for the row. Still further, each sensor latch 50 may have a synchronization (SYNC) input 55 coupled to a synchronization bus 56. The synchronization bus 56 not only extends to each sensor latch 50, but also extends to the queue latch circuit 60. The queue latch circuit 60 includes a priority refresh queue 62 (see FIG. 1) that buffers the row addresses received via the latched address bus 52. A row refresh circuit, such as the refresh row logic circuit 24 (see FIG. 1), may cause the wordline 31 associated with the row addresses in the priority refresh queue 62 to refresh each of the memory cells 32 in the row and the sensor cell 40 in the row.

In FIG. 4, the second terminal of the capacitors 36 of each memory cell 32 are illustrated as being connected to ground and the second terminal of the capacitors 46 of each second cell 40 are illustrated as being connected to ground. However, in an alternative embodiment, the second terminal of the capacitors 36 of each memory cell 32 may be connected to a voltage source and the second terminal of the capacitors 46 of each second cell 40 may be connected to a voltage source. Furthermore, FIGS. 5, 6 and 10A similarly illustrate the second terminal of each of the capacitors 36, 46 as being connected to ground, but the second terminal of each capacitor could alternatively be connected to a voltage source.

Figure 5:
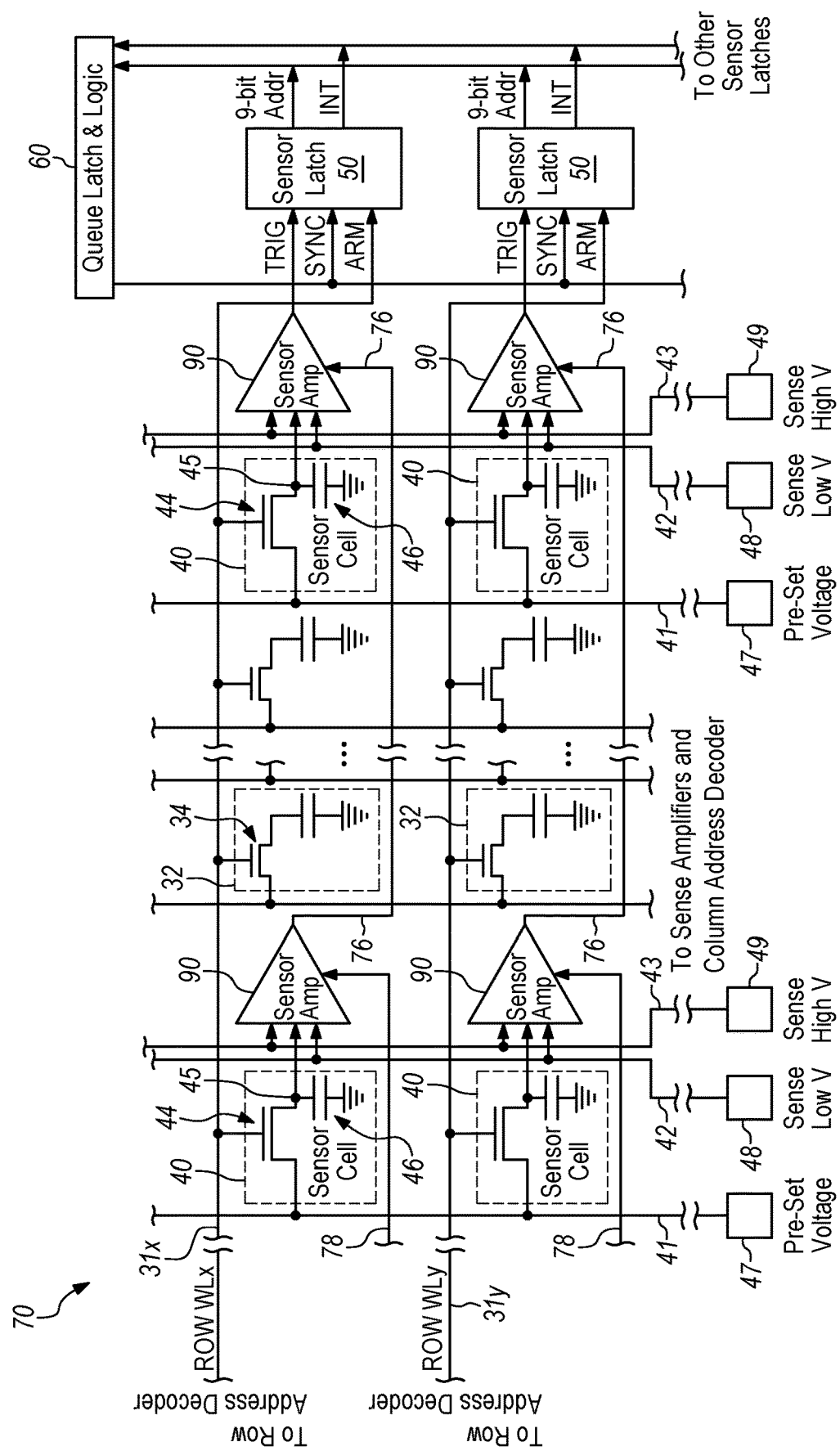
FIG. 5 is a diagram of a portion of two rows of a DRAM array that both include two sensor cells, two sensor amplifiers and a sensor latch according to some embodiments.

FIG. 5 is a diagram of a portion of two rows of a DRAM memory array 70, wherein both rows include a series of memory cells 32 (only three shown), two sensor cells 40, two sensor amplifiers 90 and a sensor latch 50 according to some embodiments. Each row includes the same types and number of components and the same types of connections. The rows of the DRAM memory array 70 in FIG. 5 is substantially similar to the rows of the DRAM memory array 30 in FIG. 4, except that the array 70 illustrates an additional column of sensor cells 40 and sensor amplifiers 90.

As described for the first (right side) column of sensor cells in reference to FIG. 4, each sensor cell 40 in the second (left side) column also includes a sensor cell transistor 44 and a sensor cell capacitor 46 having an input terminal connected to a first non-gate terminal of the sensor cell transistor 44 at point 45. For any row in the memory array 70, the wordline 31 extends from the row address decoder 17 (see FIG. 1) and is connected to a gate of each memory cell transistor 34 in the row and a gate of each sensor cell transistor 44 in the row. The wordline 31 of each row is further connected to an arm (ARM) input to the sensor latch 50 for the same row. Accordingly, when the wordline 31 for a given row is activated, the gate of each memory cell transistor 34 in the row is turned on, the gate of each sensor cell transistor 44 is turned on, and the sensor latch 50 for the row is armed. Turning on the gate of a memory cell transistor 34 connects the memory cell capacitor 36 to the bitline 33 for the column in which the memory cell 32 resides. Turning on the gates of a sensor cell transistors 44 connects the sensor cell capacitors 46 to the pre-set voltage lines 41 for the two columns of sensor cells 40.

A plurality of sensor amplifiers 90 are also provided, including one sensor amplifier for each sensor cell 40. Each sensor amplifier 90 includes a first input connected to the sensor cell 40 at the point 45 between the first non-gate terminal of the sensor cell transistor 44 and an input terminal of the sensor cell capacitor 46. Each sensor amplifier 90 further includes a second input connected to the low voltage reference line 42 and a third input connected to the high voltage reference line 43. The sensor amplifiers 90 within a row have been daisy chained together, such that the left sensor amplifier 90 has an output in communication with an output of the right sensor amplifier 90 via a line 76. Accordingly, only the output from the right sensor amplifier 90 is directly connected to the trigger (TRIG) input to the sensor latch 50 of the row, but an output signal from either of the two sensor amplifiers 90 in the row will be communicated to the trigger (TRIG) input to the sensor latch 50. Furthermore, if the row included a further sensor cell and sensor amplifier pair to the left, the output of that sensor amplifier may be daisy chained to the other sensor amplifiers via a line 78.

The two pre-set voltage lines 41 may be coupled to a common programmable voltage regulator 47 or separate programmable voltage regulators 47. The two low voltage reference lines 42 may be coupled to a common programmable voltage regulator 48 or separate programmable voltage regulator 48, and the two high voltage reference lines 43 may be coupled to a common programmable voltage regulator 49 or separate programmable voltage regulator 49. All other aspects of the DRAM array 70 of FIG. 5 may be assumed to be the same as described for the DRAM array 30 of FIG. 4.

Figure 6:
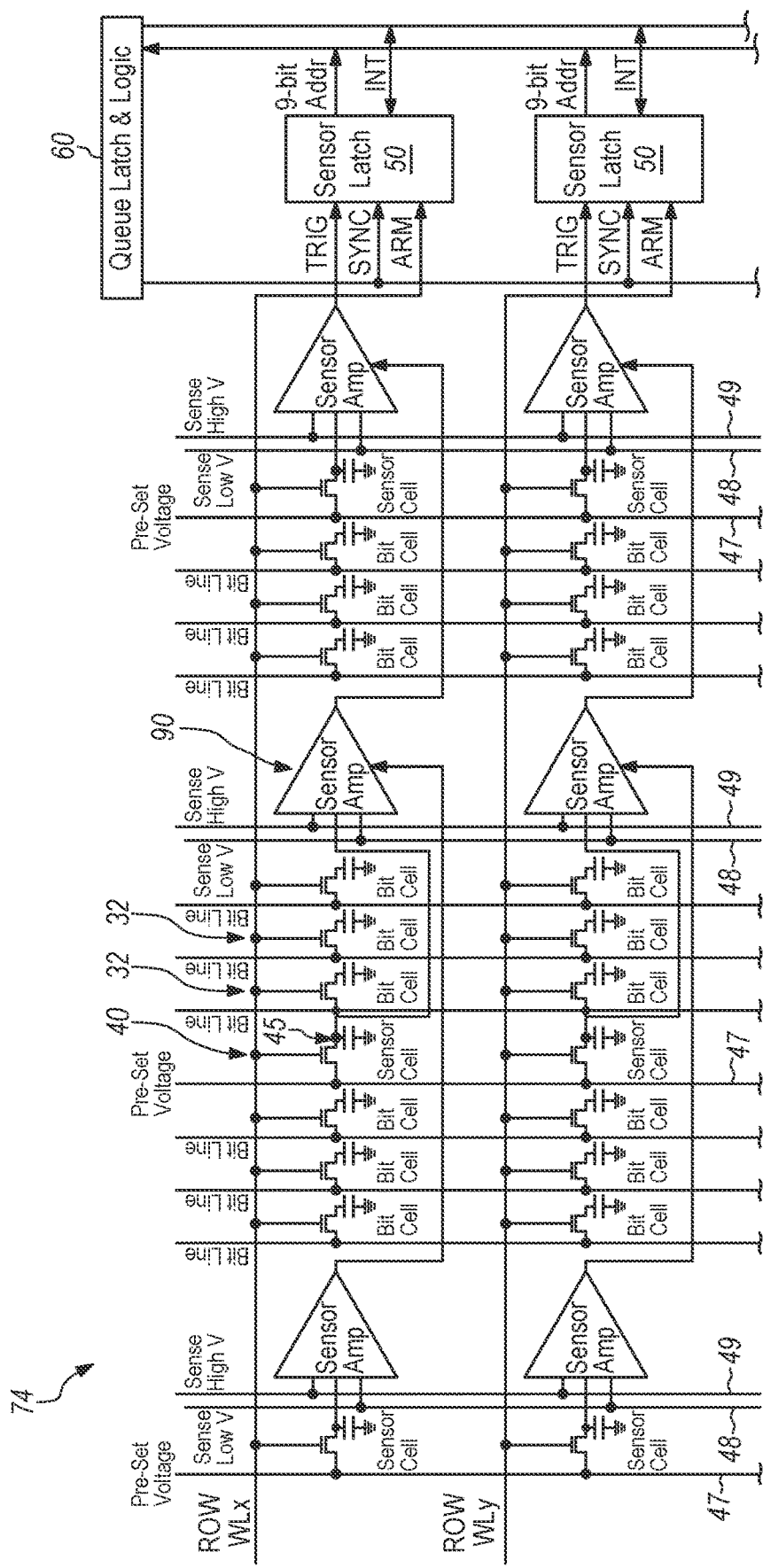
FIG. 6 is a diagram of a portion of two rows of a DRAM array that include two memory cells disposed between a sensor cell that the sensor amplifier to which the sensor cell is connected.

FIG. 6 is a diagram of a portion of two rows of a DRAM memory array 74, wherein both rows include a series of memory cells 32, three sensor cells 40, three sensor amplifiers 90 and a sensor latch 50 according to some embodiments. Each of the sensor cells 40 is connected to a sensor amplifier 90 as described in reference to FIGS. 4 and 5. Each sensor amplifier 90 is preferably physically located immediately adjacent to the corresponding sensor cell 40 to reduce line capacitance and noise effects. Accordingly, first (right-most) and third (left-most) columns of sensor cells 40 are connected to sensor amplifiers immediately adjacent the sensor cells 40. However, a second (middle) column of sensors cells 40 is physically separated from its sensor amplifier 90 by three memory cells 32. The sensor amplifier 90 is still connected to the sensor cell 40 at point 45, but the conductive line is longer. Also, the pre-set voltage line 47 coupled to the middle sensor cell 40 is now also separated from the low voltage reference line 48 and the high voltage reference line 49 that are coupled to the middle sensor amplifier 90. All other aspects of the DRAM array 74 of FIG. 6 may be assumed to be the same as described for the DRAM array 30 of FIG. 4 and/or the DRAM array 70 of FIG. 5.

Figure 7:
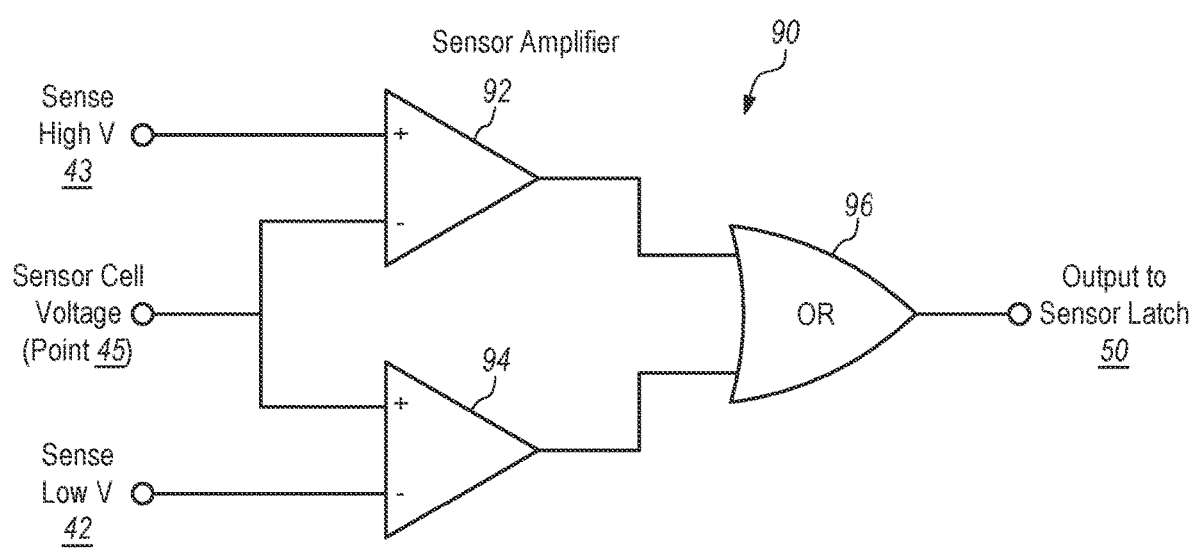
FIG. 7 is a diagram of a sensor amplifier according to some embodiments.

FIG. 7 is a diagram of a sensor latch 90 according to some embodiments. The sensor amplifier 90 may be formed by two comparators 92, 94 and an OR logic gate 96. For example, the sensor amplifier 90 may include a first comparator 92 having a first input connected to the sensor cell at point 45 and a second input connected to the high voltage reference line 43, and a second comparator 94 having a first input connected to the sensor cell at point 45 and a second input connected to the low voltage reference line 42. The outputs from the first and second comparators 92, 94 are connected to the inputs of the OR logic gate 96. Accordingly, the sensor amplifier output to the trigger (TRIG) input of the sensor latch 50 may indicate whether the voltage at the input terminal of the capacitor in the sensor cell is outside of a voltage range established by the low and high voltage reference lines 42, 43.

Figure 8:
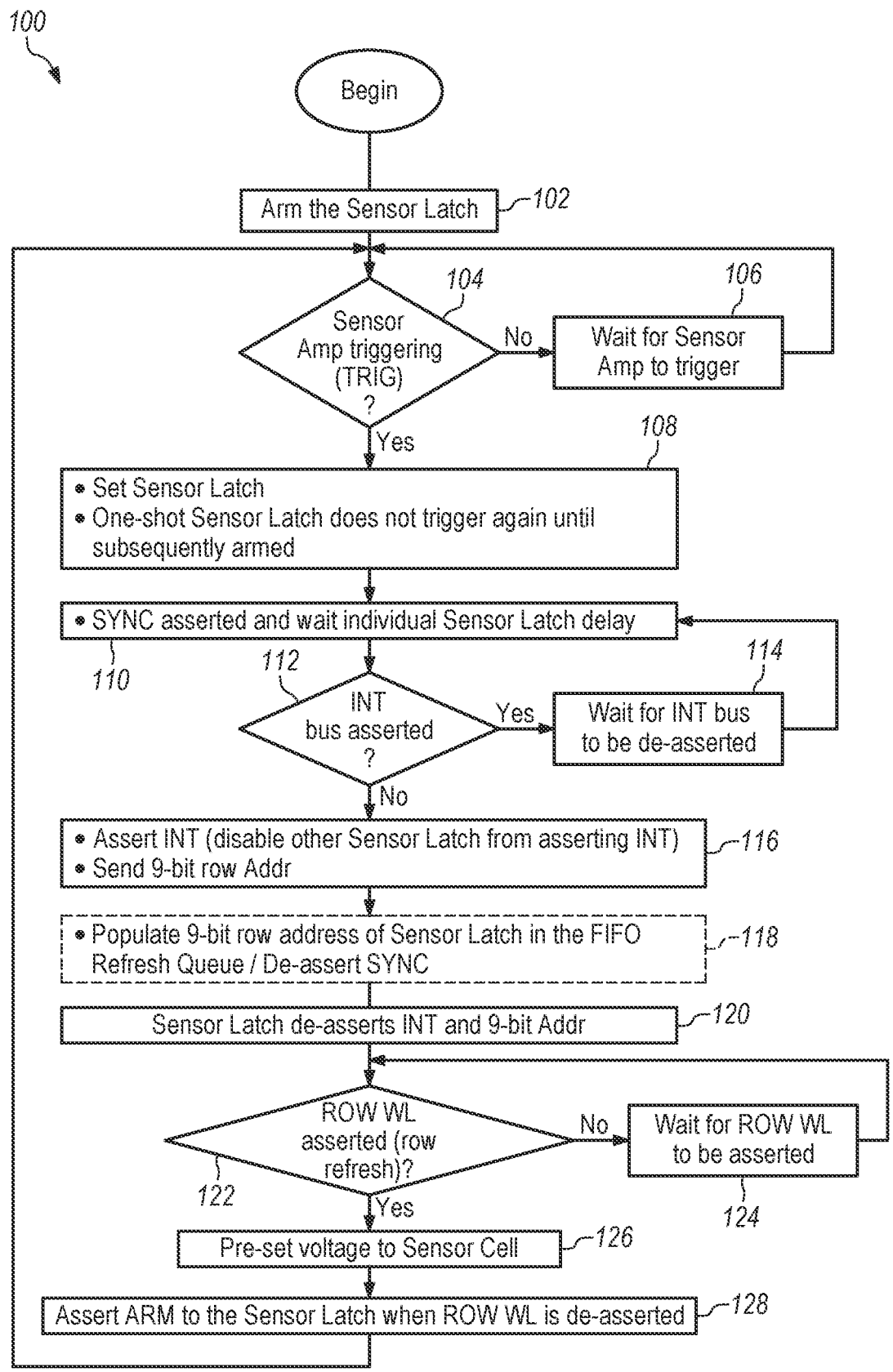
FIG. 8 is a flowchart of a process according to some embodiments of a row refresh circuit.

FIG. 8 is a flowchart of operations 100 of the sensor latch circuit 50 according to some embodiments. Operation 102 including arming the sensor latch circuit. This occurs during every activation of the wordline to which the sensor latch is connected. For example, the sensor latch may include an arm (ARM) input connected to the wordline for the row. Arming the sensor latch means that the sensor cell capacitors in the row have been charged to the pre-set voltage and that the sensor latch is enabled ("armed") to receive and latch a subsequent trigger (TRIG) input from any of the sensor amplifiers in the row. In one option, the sensor latch may become armed in response to the falling edge of the wordline (i.e., the de-assertion of an asserted wordline). Arming the sensor latch at the falling edge of the wordline signal may be beneficial since the sensor cell capacitor will have had time to charge to the pre-set voltage during the period that the wordline was active.

Operation 104 determines whether a trigger (TRIG) input has been received from the sensor amplifier(s) in the row. If not, then operation 106 includes waiting for the sensor amplifier(s) in the row to produce a trigger signal. After operation 106, the process returns to operation 104. If operation 104 determines that a trigger (TRIG) input has been received from the sensor amplifier(s), then the process advances to operation 108.

In operation 108, the sensor latch is set or "latched" for the purpose of reporting an interrupt (INT) on the interrupt bus. Once latched, the sensor latch will ignore any further trigger (TRIG) input from the sensor amplifier(s) until receiving a subsequent arm (ARM) signal via the wordline activation. In other words, the sensor latch has been temporarily disarmed from receiving any further trigger (TRIG) input.

In operation 110, the sensor latch that has received a trigger (TRIG) input while armed will sense that the queue latch has asserted a synchronization (SYNC) signal on the synchronization bus connected between all of the sensor latches in a memory mat or array. The synchronization (SYNC) signal may be a supervisor clock, such as a periodically asserted signal, that enables the sensor latches to coordinate assertion and de-assertion on the interrupt bus and the address bus to prevent bus contention or race conditions. For example, each sensor latch in a given memory cell mat or array may be individually delayed by an incrementally increasing pre-determined time period after assertion of the synchronization (SYNC) bus by the queue latch to ensure that only one sensor latch at a time can assert an interrupt (INT) and a row address. In other words, each sensor latch in the memory cell mat or array may have a unique predetermined delay period following receipt of the SYNC signal before that sensor latch can assert an interrupt (INT) signal on the interrupt bus and output a row address on the latched address bus. Since each sensor latch will receive the SYNC signal at the same time, none of the sensor latches will attempt to assert an interrupt (INT) signal at the same time and bus contention is avoided.

In operation 112, the sensor latch determines whether the interrupt bus is currently being asserted by another sensor latch. If so, then the sensor latch will wait for the interrupt bus to be de-asserted in operation 114. After the sensor latch receives a de-assertion on the interrupt bus, the process returns to operation 110 where the sensor latch waits for the queue latch to reassert the synchronization (SYNC) signal and the sensor latch again determines whether the interrupt bus is being asserted by another sensor latch. If multiple other sensor latches are keeping the interrupt bus busy, the given sensor latch may have to perform multiple waiting operations 114 and receive multiple synchronization (SYNC) signals in operations 110 before finding that the interrupt bus is available (i.e., not asserted by another sensor latch).

If the sensor latch that has received the trigger (TRIG) (Operation 104), latched (Operation 108), received a synchronization (SYNC) signal on the synchronization bus (Operation 110), and detects no interrupt (INT) signal on the interrupt bus (Operation 112), then the sensor latch may assert its own interrupt (INT) signal on the interrupt bus in Operation 116. While this sensor latch continues to assert the interrupt (INT) signal on the interrupt bus, every other sensor latch in the DRAM mat or array is prevented from asserting an interrupt. The sensor latch having its interrupt (INT) asserted on the interrupt bus may then send a row address (such as a 9-bit row address for a 512 row DRAM mat) on the latched address bus.

Embodiments include a queue latch and logic circuit (hereinafter "queue latch circuit") that is coupled to the interrupt bus, the latched address bus, and the synchronization bus. When the queue latch circuit receives a new interrupt (INT) signal on the interrupt bus, the queue latch circuit is enabled to receive and store a row address via the latched address bus. After the row address has been received by the queue latch circuit and has been stored in the priority refresh queue in Operation 118 (an operation performed by the queue latch circuit), the queue latch circuit may de-assert the synchronization (SYNC) signal on the synchronization bus indicating an acknowledgement that the row address has been successfully receive and stored.

In Operation 120, the sensor latch that has been asserting the interrupt (INT) signal may, in response to de-assertion of the synchronization (SYNC) signal, de-assert the interrupt (INT) signal from the interrupt bus and the row address from the latched address bus. The sensor latch has then completed the reporting of the disturbance occurring in its row of the memory array, and is inactive until the wordline for the row is subsequently asserted.

In Operation 122, the sensor latch determines whether the wordline (ROW WL) has then been asserted to cause a row refresh. If not, then the sensor latch waits for the wordline to the asserted in Operation 124. Assertion of the wordline directly causes the sensor cells to be charged to the pre-set voltage, as acknowledged in Operation 126. In Operation 128, the sensor latch is armed (ARM) in response to the assertion or de-assertion of the wordline (ROW WL). Following Operation 128, the sensor latch has completed the reporting of the disturbance occurring in its row of the memory array and has been armed to monitor for a subsequent sensor amplifier triggering in Operation 104.

Figure 9:
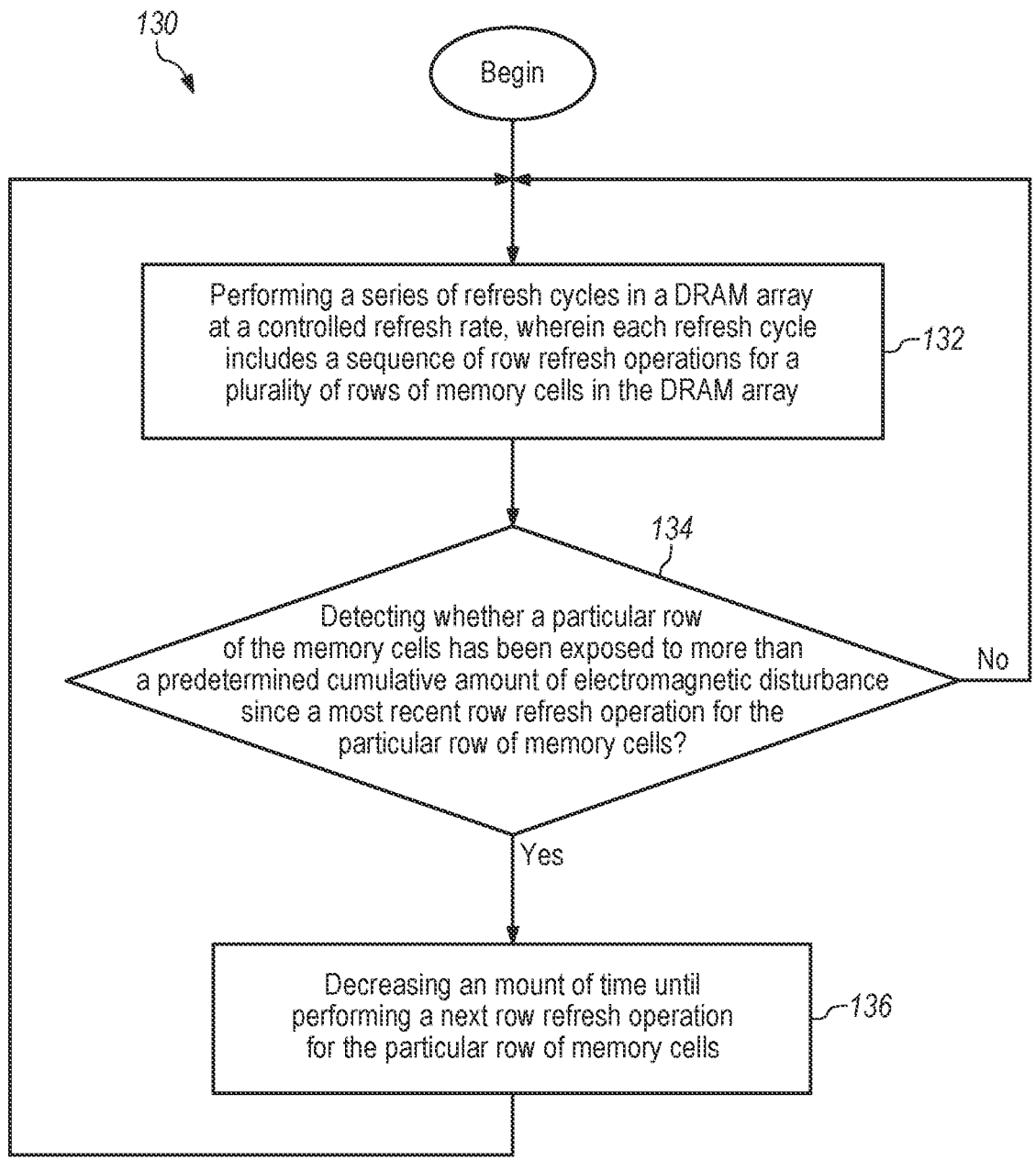
FIG. 9 is a flowchart of a process according to some embodiments of the DRAM array.

FIG. 9 is a flowchart of a method 130 performed by embodiments of the DRAM array. Operation 132 includes performing a series of refresh cycles in a DRAM array at a controlled refresh rate, wherein each refresh cycle includes a sequence of row refresh operations for a plurality of rows of memory cells in the DRAM array. Operation 134 includes detecting whether a particular row of the memory cells has been exposed to more than a predetermined cumulative amount of electromagnetic disturbance since a most recent row refresh operation for the particular row of memory cells. If not, then the method returns to Operation 132 to continue performing periodic refreshes. However, if Operation 134 does detect that a particular row of the memory cells has been exposed to more than a predetermined cumulative amount of electromagnetic disturbance since a most recent row refresh operation for the particular row of memory cells, then the method continues to Operation 136. Operation 136 includes decreasing an amount of time until performing a next row refresh operation for the particular row of memory cells.

Figure 10A:
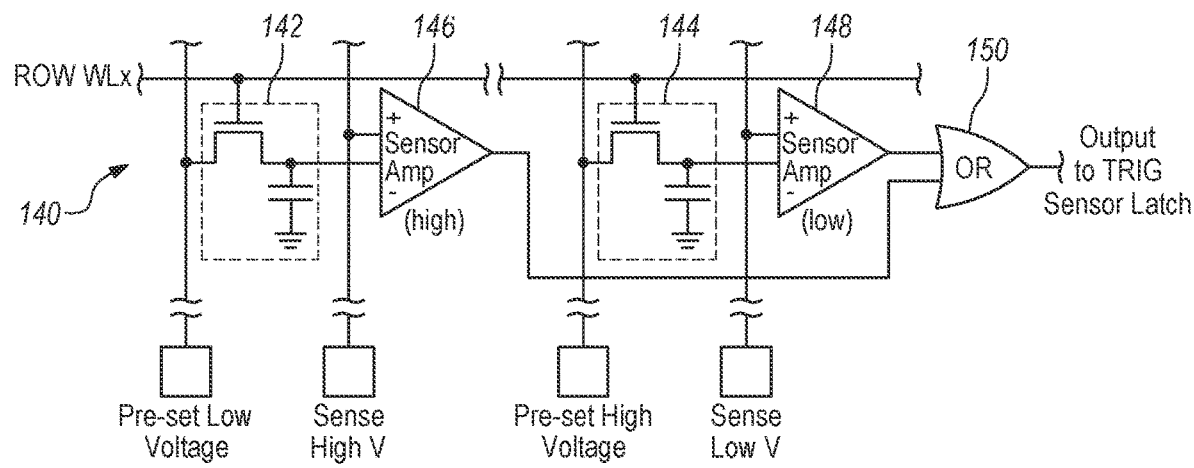
FIGS. 10A-C are diagrams of sensor cells and the operation of the sensor cells according to some embodiments.
Figure 10B:
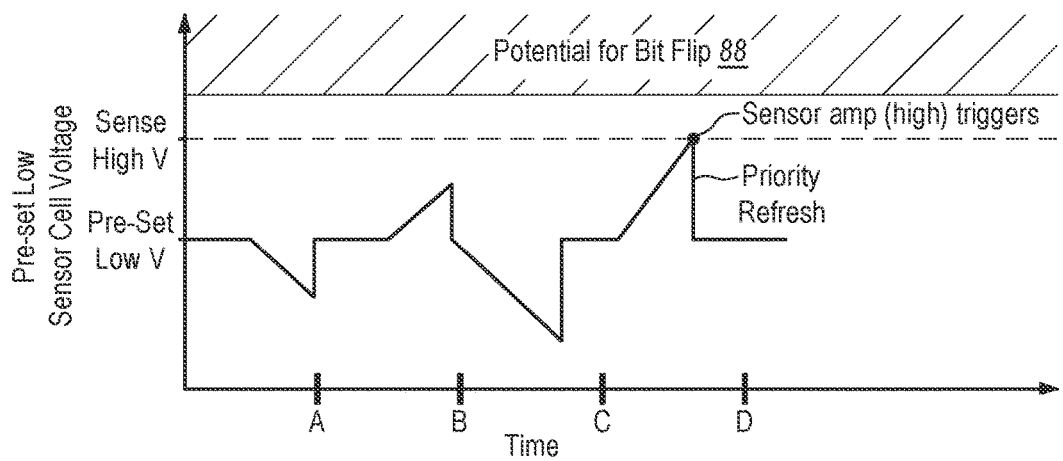
Figure 10C:
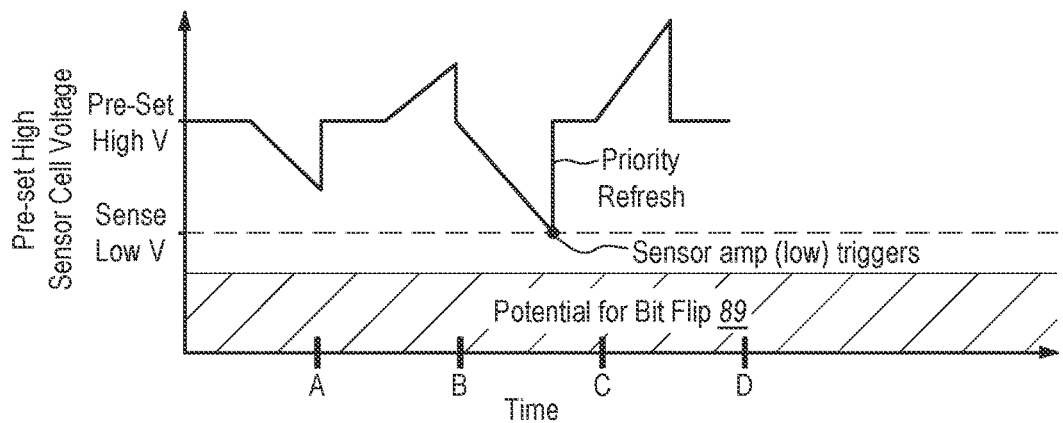

FIGS. 10A-C are diagrams of sensor cells and the operation of the sensor cells according to some embodiments. FIG. 10A is a partial system diagram for use in various DRAM systems such as those of FIGS. 4-6. It should be recognized that FIG. 10A illustrates only the sensor cells for use in a single row of memory cells and does not illustrate the memory cells or sensor latch for the single row. However, FIG. 10A illustrates a row 140 of a DRAM array having a high sensor cell 142 and a separate low sensor cell 144. The high sensor cell 142 is coupled to a high sensor amp 146 and the low sensor cell 144 is coupled to a low sensor amp 148. The output of the high sensor amp 146 and the output of the low sensor amp 148 are coupled to the inputs of a logical OR gate 150, such that the output from the logical OR gate 150 forms an output signal to the TRIG input of the sensor latch for the row (for example, see TRIG input 53 to sensor latch 50 in FIG. 4). Whereas the sensor amps of FIGS. 4-6 are triggered upon the sensor cell voltage of the associated sensor cell reaching either of two criteria, i.e., exceeding the sense high voltage and/or the sensor cell voltage falling below the sense low voltage, the sensor amps 146, 148 of FIG. 10A include a high sensor amp 146 that triggers only upon the sensor cell voltage of a first sensor cell 142 exceeding the sense high voltage and a separate low sensor amp 148 that triggers only upon the sensor cell voltage of a second sensor cell 144 falling below the sense low voltage. The embodiment of sensor cells and sensor amps disclosed in FIG. 10A may be implemented in combination with other aspects, features, options, and embodiments discloses herein, including the embodiments of FIGS. 4-6.

FIG. 10B is a graph of hypothetical changes in sensor cell voltage over time, similar to those show in FIG. 3. The graph plots sensor cell voltage (on the Y-axis) as a function of time (on the X-axis). The Y-axis is labeled with two voltages. The pre-set low voltage is the voltage on the pre-set low voltage line that is used to charge the high sensor cell 142 (see FIG. 10A) capacitors during a refresh. The sense high voltage is the high voltage reference that a voltage regulator establishes on a high voltage refence line. After the high sensor cell capacitor is charged to the pre-set low voltage, the high sensor cell capacitor may lose or gain charge over time resulting in a reduction or increase in the voltage of the high sensor cell capacitor. If the high sensor cell capacitor voltage remains below the sense high voltage value (see upper dashed horizontal line) between periodic (scheduled) refresh cycles, then the row containing the high sensor cell will be refreshed at the predetermined refresh rate. The periodic refresh cycles generated by the refresh counter are illustrated by a series of four, evenly-spaced tick-marks (A-D) on the X-axis. However, if the high sensor cell capacitor voltage rises to the sense high voltage value (see "sense amp (high) triggers"), then the row containing the high sensor cell will be identified for a priority refresh before the conditions can induce a bit flip in any of the memory cells in the row. For example, the area 88 may represent conditions under which a memory cell might experience a bit flip due to charge gain (voltage increase). Applying the methodology of the described embodiments, the sensor cell voltage never reaches area 88 where there is potential for a bit flip.

FIG. 10C is a graph of hypothetical changes in sensor cell voltage over time, similar to those show in FIGS. 3 and 10A. The graph plots sensor cell voltage (on the Y-axis) as a function of time (on the X-axis). The Y-axis is labeled with two voltages. The pre-set high voltage is the voltage on the pre-set high voltage line that is used to charge the low sensor cell 144 (see FIG. 10A) capacitors during a refresh. The sense low voltage is the low voltage reference that a voltage regulator establishes on a low voltage refence line. After the low sensor cell capacitor is charged to the pre-set high voltage, the low sensor cell capacitor may lose or gain charge over time resulting in a reduction or increase in the voltage of the high sensor cell capacitor. If the low sensor cell capacitor voltage remains above the sense low voltage value (see lower dashed horizontal line) between periodic (scheduled) refresh cycles, then the row containing the low sensor cell will be refreshed at the predetermined refresh rate. The periodic refresh cycles generated by the refresh counter are illustrated by a series of four, evenly-spaced tick-marks (A-D) on the X-axis. However, if the low sensor cell capacitor voltage drops to the sense low voltage value (see "sense amp (low) triggers"), then the row containing the low sensor cell will be identified for a priority refresh before the conditions can induce a bit flip in any of the memory cells in the row. For example, the area 89 may represent conditions under which a memory cell might experience a bit flip due to charge loss (voltage decrease). Applying the methodology of the described embodiments, the sensor cell voltage never reaches area 89 where there is potential for a bit flip.

As will be appreciated by one skilled in the art, embodiments may take the form of a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random-access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. Furthermore, any program instruction or code that is embodied on such computer readable storage media (including forms referred to as volatile memory) that is not a transitory signal are, for the avoidance of doubt, considered "non-transitory".

Program code embodied on a computer readable storage medium may be transmitted using any appropriate medium, including but not limited to wireless, wireline, optical fiber cable, RF, etc., or any suitable combination of the foregoing. Computer program code for carrying out various operations may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments may be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored on computer readable storage media is not a transitory signal, such that the program instructions can direct a computer, other programmable data processing apparatus, or other devices to function in a particular manner, and such that the program instructions stored in the computer readable storage medium produce an article of manufacture.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to limit the scope of the claims. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the embodiment.

The corresponding structures, materials, acts, and equivalents of all means or steps plus function elements in the claims below are intended to include any structure, material, or act for performing the function in combination with other claimed elements as specifically claimed. Embodiments have been presented for purposes of illustration and description, but it is not intended to be exhaustive or limited to the embodiments in the form disclosed. Many modifications and variations will be apparent to those of ordinary skill in the art after reading this disclosure. The disclosed embodiments were chosen and described as non-limiting examples to enable others of ordinary skill in the art to understand these embodiments and other embodiments involving modifications suited to a particular implementation.

What is claimed is:

1. An apparatus, comprising:
   a dynamic random-access memory array including a plurality of memory cells physical arranged in a row, wherein each of the memory cells includes a memory cell transistor and a memory cell capacitor having an input terminal connected to a first non-gate terminal of the memory cell transistor, and wherein each of the memory cells includes a second non-gate terminal to the memory cell transistor that is connected to a bitline for reading data from and writing data to the memory cell;
   a sensor cell physically located in the row with the memory cells, wherein the sensor cell includes a sensor cell transistor and a sensor cell capacitor having an input terminal connected to a first non-gate terminal of the sensor cell transistor, and wherein the sensor cell includes a second non-gate terminal to the sensor cell transistor that is connected to a pre-set voltage line;
   a wordline extending from a row address decoder and connected to a gate of each memory cell transistor in the row and a gate of the sensor cell transistor in the row;
   a sensor amplifier including a first input connected to the sensor cell at a point located between the first non-gate terminal of the sensor cell transistor and an input terminal of the sensor cell capacitor, a second input connected to a high voltage reference line, a third input connected to a low voltage reference line, and an output in communication with a row refresh circuit;
   a first programmable voltage regulator for applying a first level of voltage to the high voltage reference line; and
   a second programmable voltage regulator for applying a second level of voltage to the low voltage reference line, wherein the first level of voltage on the high voltage reference line is greater than a level of voltage on the pre-set voltage line, and wherein the second level of voltage on the low voltage reference line is less than the level of voltage on the pre-set voltage line.

2. An apparatus, comprising:
   a dynamic random-access memory array including a plurality of memory cells physical arranged in a row, wherein each of the memory cells includes a memory cell transistor and a memory cell capacitor having an input terminal connected to a first non-gate terminal of the memory cell transistor;
   a sensor cell physically located in the row with the memory cells, wherein the sensor cell includes a sensor cell transistor and a sensor cell capacitor having an input terminal connected to a first non-gate terminal of the sensor cell transistor;
   a wordline extending from a row address decoder and connected to a gate of each memory cell transistor in the row and a gate of the sensor cell transistor in the row;
   a sensor amplifier including a first input connected to the sensor cell at a point located between the first non-gate terminal of the sensor cell transistor and an input terminal of the sensor cell capacitor, a second input connected to a high voltage reference line, a third input connected to a low voltage reference line, and an output in communication with a row refresh circuit;
   a sensor latch circuit connected to the output of the sensor amplifier; and
   a queue latch circuit coupled to the sensor latch circuit by an interrupt line and a latched address bus, wherein the queue latch circuit causes the wordline to refresh each of the memory cells in the row and the sensor cell in the row in response to receiving a row address over the latched address bus that identifies the row that includes the wordline.

3. An apparatus, comprising:
a dynamic random-access memory array including a plurality of memory cells physical arranged in rows, wherein each memory cell includes a memory cell transistor and a memory cell capacitor having an input terminal connected to a first non-gate terminal of the memory cell transistor;
a plurality of sensor cells, wherein each sensor cell is physically located in one of the rows of memory cells, and wherein each sensor cell includes a sensor cell transistor and a sensor cell capacitor having an input terminal connected to a first non-gate terminal of the sensor cell transistor;
a plurality of wordlines including a wordline for each row of the memory cells, wherein the wordline for each row is connected to a gate of each memory cell transistor in the row and to a gate of each sensor cell transistor in the row; and
a plurality of sensor amplifiers including a sensor amplifier for each sensor cell, wherein, for each sensor cell, the sensor amplifier for the sensor cell includes a first input connected to the sensor cell at a point between the first non-gate terminal of the sensor cell transistor and an input terminal of the sensor cell capacitor, a second input connected to a high voltage reference line, a third input connected to a low voltage reference line, and an output in communication with a row refresh circuit.

4. The apparatus of claim 3, wherein, for each row, each of the memory cells in the row includes a second non-gate terminal to the memory cell transistor that is connected to a bitline for reading data from and writing data to the memory cell, and wherein, for each row, each sensor cell in the row includes a second non-gate terminal to the sensor cell transistor that is connected to a pre-set voltage line.

5. The apparatus of claim 4, further comprising:
a first programmable voltage regulator for applying a first level of voltage to the high voltage reference line; and
a second programmable voltage regulator for applying a second level of voltage to the low voltage reference line, wherein the first level of voltage on the high voltage reference line is greater than a level of voltage on the pre-set voltage line, and wherein the second level of voltage on the low voltage reference line is less than the level of voltage on the pre-set voltage line.

6. The apparatus of claim 5, wherein the plurality of memory cells are further arranged in columns, wherein, for each of the memory cells in one of the columns, the second non-gate terminal to the memory cell transistor of the memory cell is connected to a bitline for the column; and
wherein the plurality of sensor cells are further arranged in a column, and wherein the second non-gate terminal to the sensor cell transistor of each of the sensor cells in the column is connected to the pre-set voltage line.

7. The apparatus of claim 5, further comprising:
a third programmable voltage regulator for applying the pre-set voltage to the pre-set voltage line.

8. The apparatus of claim 3, wherein the sensor cell capacitors of the sensor cells have less capacitance than the memory cell capacitors of the memory cells.

9. The apparatus of claim 3, wherein every row of the memory cells includes at least one of the sensor cells.

10. The apparatus of claim 3, wherein every row of the memory cells includes more than one of the sensor cells and more than one of the sensor amplifiers.

11. The apparatus of claim 10, wherein the more than one of the sensor amplifiers in a row are daisy chained together.

12. The apparatus of claim 3, wherein the row refresh circuit comprises:
a plurality of sensor latch circuits, wherein, for each row of memory cells that includes at least one of the sensor cells, one of the sensor latch circuits has an input coupled to the output of each sensor amplifier that is connected to the at least one of the sensor cells included in the row or memory cells; and
a row refresh queue connected to each of the sensor latch circuits by an interrupt line and a latched address bus, wherein the row refresh circuit cause a refresh of each memory cell and each sensor cell in a particular row of the dynamic random-access memory array in response to receiving a row address over the latched address bus that identifies the particular row.

13. The apparatus of claim 12, wherein the row refresh queue includes first-in, first-out storage for a plurality of row addresses received over the latched address bus.

14. The apparatus of claim 12, further comprising:
a multiplexer for directing row refresh instructions to a row address decoder from a refresh counter and from the row refresh queue.

15. A method, comprising:
performing a series of refresh cycles in a DRAM array at a controlled refresh rate, wherein each refresh cycle includes a sequence of row refresh operations for a plurality of rows of memory cells in the DRAM array;
detecting whether a particular row of the memory cells has been exposed to more than a predetermined cumulative amount of electromagnetic disturbance since a most recent row refresh operation for the particular row of memory cells; and
decreasing an amount of time until performing a next row refresh operation for the particular row of memory cells in response to determining that the particular row of memory cells has been exposed to more than a predetermined cumulative amount of electromagnetic disturbance since the most recent periodic refreshing of the particular row of memory cells.

16. The method of claim 15, wherein decreasing an amount of time until performing a next row refresh operation for the particular row of memory cells includes refreshing the particular row of memory cells prior to a next refresh cycle.

17. The method of claim 15, wherein decreasing an amount of time until performing a next row refresh operation for the particular row of memory cells includes altering an order of the sequence of row refresh operations in the next refresh cycle so that the particular row of memory cells is refreshed earlier in the sequence of row refresh operations of the next refresh cycle.

18. The method of claim 15, wherein decreasing an amount of time until performing a next row refresh operation for the particular row of memory cells includes increasing the controlled refresh rate for the DRAM array.

19. The method of claim 15, wherein detecting whether the particular row of memory cells has been exposed to more than a predetermined cumulative amount of electromagnetic disturbance between the regular periodic refreshes includes:
detecting a voltage of a sensor cell that is physically located in the particular row of memory cells; and comparing the detected voltage to a high voltage reference and a low voltage reference, wherein the particular row of memory cells is determined to have been exposed to more than a predetermined cumulative amount of electromagnetic disturbance in response to the detected voltage of the sensor cell being greater than the high voltage reference or less than the low voltage reference.

20. The method of claim 19, wherein the sensor cell includes a sensor cell transistor and a sensor cell capacitor having an input terminal connected to a first non-gate terminal of the sensor cell transistor, and wherein the voltage of the sensor cell is detected at a point between the non-gate terminal of the sensor cell transistor and an input terminal of the sensor cell capacitor.

21. The method of claim 19, further comprising:
charging the sensor cell to a pre-set voltage during each refresh of the particular row of memory cells including the sensor cell.

\* \* \* \* \*